(12) United States Patent
Efrat et al.

(10) Patent No.: US 10,488,471 B2
(45) Date of Patent: *Nov. 26, 2019

(54) SYSTEM AND A METHOD FOR MAPPING A MAGNETIC FIELD

(71) Applicant: Elbit Systems Ltd., Haifa (IL)

(72) Inventors: Ilan Efrat, Haifa (IL); Evgeni Gurovich, Zichron-Yakov (IL); Guy Mencel, Pardes Hanna-Karkur (IL); Yoav Ophir, Zichron-Yakov (IL); Mark Gandelsman, Haifa (IL)

(73) Assignee: ELBIT SYSTEMS LTD, Haifa (IL)

( * ) Notice: Subject to any disclaimer, the term of this patent is extended or adjusted under 35 U.S.C. 154(b) by 382 days.

This patent is subject to a terminal disclaimer.

(21) Appl. No.: 15/398,316

(22) Filed: Jan. 4, 2017

(65) Prior Publication Data

US 2017/0115364 A1 Apr. 27, 2017

Related U.S. Application Data

(63) Continuation-in-part of application No. 14/249,463, filed on Apr. 10, 2014, now Pat. No. 10,095,815, (Continued)

(30) Foreign Application Priority Data

Nov. 19, 2008 (IL) .......................................... 195389

(51) Int. Cl.
*G06F 17/50* (2006.01)
*G01R 33/10* (2006.01)
*G01R 33/07* (2006.01)

(52) U.S. Cl.
CPC ........... *G01R 33/10* (2013.01); *G01R 33/072* (2013.01)

(58) Field of Classification Search
CPC .... G06F 17/5009; G01R 33/072; G01R 33/10
(Continued)

(56) References Cited

U.S. PATENT DOCUMENTS

| 5,619,323 A | 4/1997 | Hamilton |
| 5,646,524 A | 7/1997 | Gilboa |

(Continued)

FOREIGN PATENT DOCUMENTS

| EP | 2353021 | 3/2014 |
| WO | 2006054295 | 5/2006 |

OTHER PUBLICATIONS

Wu, Xiaohui: "A Framework for Calibration of Electromagnetic Surgical Navigation Systems", Proceedings of the 2003 IEEE/RSJ Intl. Conference on Intelligent Robots and Systems, Oct. 2003.

(Continued)

*Primary Examiner* — Eunhee Kim

(57) ABSTRACT

System for mapping a magnetic-field including a magnetic-field-transmitter, a freestanding magnetic-field-detector operative to freely move within a volume of interest and acquire measurements of the flux of the magnetic-field at a plurality of poses, a pose-information-acquisition-module for measuring information related to the pose of the magnetic-field-detector and a processor, coupled with the magnetic-field-detector and with said pose-information-acquisition-module and determines pose-related-information respective of each of at least a portion of the magnetic-flux-measurements, according to said information related to the pose of said magnetic-field-detector, the processor further estimating the entire set of parameters of a magnetic-field-model-template according to the magnetic-flux-measurements and the respective pose-related-information the magnetic flux measurements, the processor incorporates the entire set of parameters into said magnetic field model template, thereby determining said magnetic field model, the (Continued)

entire set of parameters includes the coefficients, the order, the number and location of the centers of expansion of the model.

27 Claims, 10 Drawing Sheets

Related U.S. Application Data which is a continuation-in-part of application No. 13/129,781, filed as application No. PCT/IL2009/001043 on Nov. 5, 2009, now Pat. No. 8,700,376.

(58) Field of Classification Search
USPC ..................................................... 703/10, 13
See application file for complete search history.

(56) References Cited

U.S. PATENT DOCUMENTS

| | | | |
|---|---|---|---|
| 5,646,525 A | 7/1997 | Gilboa | |
| 5,760,335 A | 6/1998 | Gilboa | |
| 5,847,976 A | 12/1998 | Lescourret | |
| 6,288,785 B1 | 9/2001 | Frantz et al. | |
| 7,277,834 B2 | 10/2007 | Bar Tal | |
| 7,542,869 B2 | 6/2009 | Gandelsman | |
| 7,603,251 B1 | 10/2009 | Wiegert et al. | |
| 7,805,269 B2 | 9/2010 | Glossop | |
| 7,835,785 B2 | 11/2010 | Scully et al. | |
| 8,200,314 B2 | 6/2012 | Bladen et al. | |
| 2007/0035563 A1 | 2/2007 | Biocca | |
| 2007/0299623 A1 | 12/2007 | Gandelsman | |
| 2009/0012532 A1 | 1/2009 | Quaid et al. | |
| 2009/0281417 A1 | 11/2009 | Hartmann et al. | |

OTHER PUBLICATIONS

Kindratenko, Volodymyr: "Calibration of electromagnetic tracking devices", Virtual Reality: Research, Development, and Applications, 1999, pp. 139-150, vol. 4.

Sato, Ken et al: "A Free Scanning Method for Measuring Magnetic Distributions Using Magnetic Tracker", IEICE, 2009.

Chung, Adrian J, et al: "Freehand Cocalibration of Optical and Electromagnetic Trackers for Navigated Bronchoscopy", Workshop Paper, Medical Imaging and Augmented Reality (MIAR 2004): Second International Workshop, 2004, pp. 311-319.

Ren, Hongliang: "Investigationg of Attitude Tracking Using an Integrated Inertial and Magnetic Navigation System for Hand-Held Surgical Instruments", IEEE/ASME Transactions on Mechatronics, Apr. 2012, vol. 17, No. 2.

Livingston, Mark et al: "Magnetic Tracker Calibration for Improved Augmented Reality Registration", Article in Presence Teleoperators & Virtual Environments 6, Oct. 1997.

Wang, Jih-Fang: "A Real-time Optical 6D Tracker for Head-Mounted Display Systems", Dissertation submitted to University of North Carolina at Chapel Hill, 1990.

Crowley, James L et al: "Principles and Techniques for Sensor Data Fusion", Signal Processing, May 1993, vol. 32, Issues 1-2.

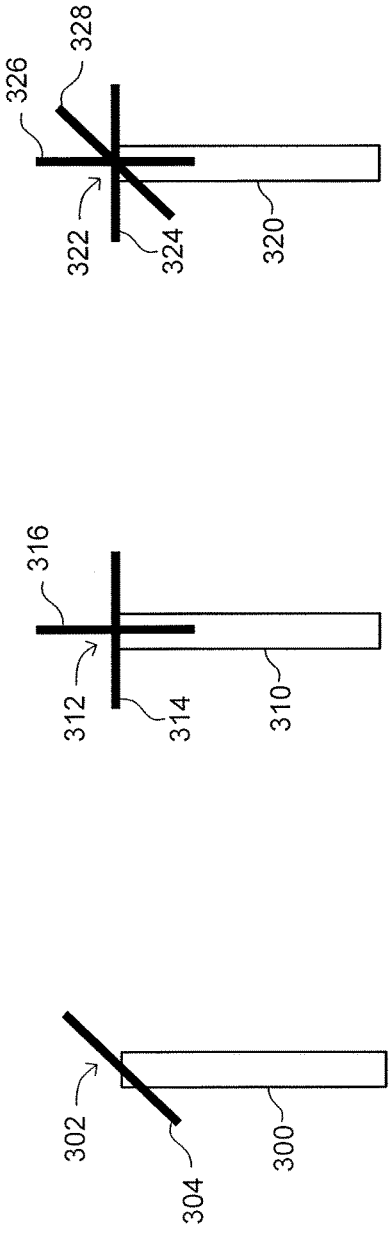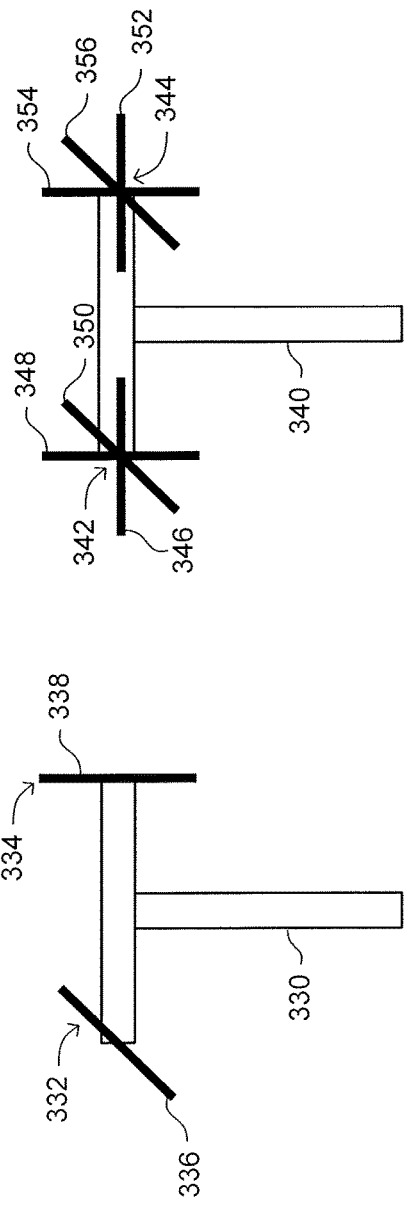

SYSTEM AND A METHOD FOR MAPPING A MAGNETIC FIELD

FIELD OF THE DISCLOSED TECHNIQUE

The disclosed technique relates to magnetic field, in general, and to systems and methods for mapping magnetic fields, in particular.

BACKGROUND OF THE DISCLOSED TECHNIQUE

Applications of tracking an object, within a volume of interest, are known in the art. For example, tracking a helmet, worn by a pilot in a cockpit is used to determine the location and orientation that the pilot is looking at (i.e., by further determining the gaze direction of the eye of the pilot). Tracking a catheter, within a body of a patient, may be used to display a representation of the catheter on an image of the body (e.g., an X-Ray image, CT image, MRI image, PET image and the like). Tracking various body parts of a person may be used to emulate the movement of that person in a virtual reality environment.

Systems for tracking an object, within a volume of interest using magnetic fields, are known in the art. These systems are referred to herein as "magnetic tracking systems". Magnetic tracking systems track the object by repeatedly determining the location and orientation of the object, in the volume of interest, relative to a coordinate system associated with the magnetic tracking system. The term "pose" refers hereinafter to either location, orientation or both. The term "location" relates to the coordinates of an object (i.e., according to a determined coordinate system such as X, Y, Z) and the term "orientation" relates to the direction of the object in the determined coordinate system (e.g., Eulers angles). The term "magnetic coordinate system" refers hereinafter to a coordinate system associated with the magnetic tracking system. In general, magnetic tracking systems employ a magnetic field transmitter and a magnetic field detector. The magnetic field transmitter may employ several magnetic field generators (e.g., coils with electric current flowing there through). The magnetic field detector may employ several magnetic field sensors (e.g., coils with electric current induced therein, hall-effect sensors). In general, for the purpose of magnetic tracking, the number of generators times the number of sensors should at least equal the number of required location and orientation parameters (e.g., the number of required location and orientation parameters may be six, three for location and three for orientation). According one configuration of magnetic tracking systems, the magnetic field transmitter is fixed at a known pose in the volume of interest and the magnetic field detector is mounted on the tracked object. According to another configuration of magnetic tracking systems, the magnetic field transmitter is mounted on the tracked object and the magnetic field detector is fixed at a known pose in the volume of interest.

To determine the position of the tracked object, within a volume of interest, using magnetic fields, the amplitude and direction of the magnetic field at each location in the volume of interest should be known (i.e., either measured or computed). The amplitude and direction of the magnetic field is referred to hereinafter as the "magnetic field vector". The ensemble of magnetic field vectors at corresponding locations in the volume of interest is referred to hereinafter as the "magnetic field map". The magnetic tracking system determines the pose of a tracked object by measuring the magnetic flux at that pose. The magnetic tracking system determines the magnetic field vector according to the measured magnetic flux, and determines the pose corresponding to that magnetic field vector according to the magnetic field map.

A magnetic field map may have one of several forms. Accordingly, the magnetic field map may have the form of a physical model relating each location in the volume of interest with an amplitude and direction of the magnetic field. The physical model includes physical parameters. For example, when the magnetic field is generated by a coil, the magnetic field model may be that of a dipole with physical parameters such as coil radius and the number of turns of the coil. Alternatively, the magnetic field map may have the form of a mathematical model, without any knowledge of the physical parameters of the magnetic field (e.g., polynomial, spline). According to yet another alternative, the magnetic field map may be in the form of a Look Up Table (LUT) associating between a selected number of known locations in the volume of interest with corresponding values of the magnetic field vectors at these selected locations. The value of the magnetic field vectors, between entries in the LUT, is determined according to an interpolation scheme (e.g., an interpolation function such as a straight line, a sinc function etc).

The magnetic field map may be determined at the manufacturing stage of the magnetic field transmitter. However, such a map does not allow for all the interferences introduced to the magnetic field in a specific volume of interest (e.g., interferences caused by ferromagnetic objects or other electromagnetic transmitters within the volume of interest). The magnetic field map may be determined, prior to tracking, individually for each volume of interest. This map includes the interferences (i.e., when those exist) introduced to the magnetic field in the volume of interest (e.g., due to metallic objects present in the volume of interest). Accordingly, the magnetic field transmitter is activated and the magnetic field detector is moved through a plurality of known poses in the volume of interest. The magnetic field detector measures the magnetic field vector at each known location. A processor processes these measurements and produces the magnetic field map. When the magnetic field map is a physical model or a mathematical model, the processor estimates the parameters (i.e., the physical parameters or the mathematical parameters) to determined the model that best fits the measurements. When the magnetic field map is a LUT, the processor constructs the LUT according to the measurements and the known locations. It is noted that the term "mapping" refers to herein after to determining the magnetic field map. The terms "magnetic field model" and "model" will be used herein interchangeably.

Additionally, when the magnetic tracking system is required to determine the pose of the tracked object in a coordinates system associated with the volume of interest, the magnetic tracking system registers the magnetic field map with the coordinate system associated with the volume of interest. The coordinate system associated with the volume of interest is referred to herein as the "reference coordinate system". The term "registering" refers to determining a correspondence between the poses relative to the magnetic coordinate system and the poses relative to the reference coordinate system. This reference coordinate system is, for example, the coordinate system of the airplane, the coordinate system of a virtual environment or the coordinate system of a medical image. Thus, the location and orientation of the tracked object is known relative to the reference coordinate system. The magnetic tracking system registers the magnetic field map with a reference coordinate system for example, by placing the magnetic field detector at a known pose relative to the reference coordinate system and determines the pose of the magnetic field detector relative to the magnetic coordinate system. Alternatively, when the pose of the magnetic field transmitter, relative to the reference coordinate system, is known, each pose relative to the magnetic coordinate system is associated with a respective pose relative to the reference coordinate system.

The publication to Livingston et al., entitled "Magnetic Tracker Calibration for Improved Augmented Reality Registration", directs to a system and a method for mapping a magnetic field using LUT and for registering the magnetic field map with a reference coordinate system. According to Livingston et al., a magnetic tracking system tracks the pose of a receiver attached to the object being tracked. However, metal and electromagnetic devices (e.g., computers, Cathode Ray Tubes, metal objects and electrical wirings) distort the field created by the transmitter. Therefore, the magnetic field model, used by the magnetic tracking system, may be inaccurate. Thus, the system to Livingston et al maps the magnetic field and determines correction factors for each location in the volume of interest. Accordingly, the receiver is attached to six degrees of freedom mechanical arm tracker, which determines a vector of locations and orientations of the tip of the arm relative to the base of the arm. The coordinates system associated with the mechanical tracking systems serves as the reference coordinate system. Thus, each pose determined by the magnetic tracking system, has a pose determined by the mechanical tracking system associated therewith. The differences between these associated poses are used to determine the corrections needed for the poses determined by the magnetic tracking system.

U.S. Pat. No. 5,847,976 to Lescourret, entitled "Method to Determine the Position and Orientation of a Mobile System, Especially the Line Of Sight in a Helmet Visor", directs to analytic modeling of electromagnetic fields. These fields include a first electromagnetic field created by a transmitter, a second field created by eddy currents induced in metal object within the volume of interest by a first field and a third field created by currents induced in the tracked object (e.g., a helmet of a pilot) by the first and second fields. Each one of the three fields is characterized independently of the other fields by the coefficients of a model associated with each field.

The first field is determined by measuring the field created by the transmitter in free space. The field is measured at points of measurements by translating a mechanical system bearing the sensor through these points. The parameters of a model of this field are estimated.

The second field is determined by measuring the field within the volume of interest including the metal objects. The field is measured at points of measurements by translating a mechanical system bearing the sensor through these points. The parameters of a combined model including both the first and the second field are estimated. The model of the first field is subtracted from this combined model.

The third field is determined by first plunging disturbance sources into the magnetic field produced by the transmitter. The model of the disturbance due to each disturbance source, at the sensor, is modeled as an explicit function of the existing mean field at the point of origin of a coordinate system defining this source. Thus, the model of each source depends explicitly on the field into which each source is plunged into. In a second stage, the sensor is plunged into the magnetic field and the disturbance caused by each source is determined by its model and of the mean magnetic field. In a third stage, disturbances due to the sources are summed. Finally, in a fourth stage, this sum is deducted from the measurement made by the sensor. In this way, all the parameters of the source model representing the phenomenon of disturbance produced by this source are independent of the field into which the sensor and all the sources are plunged.

The publication entitled "A Framework for Calibration of Electromagnetic Surgical Navigation Systems" to Wu et al directs to employing a 3D optical navigation system to calibrate the measurement distortion of a magnetic tracking system. To that end the publication to Wu et al directs to employing a Lego robot which moves semi-statically within the desired calibration space with infrared tracking markers and the magnetic tracking sensors attached thereto. The calibration process includes three steps, registration between the magnetic tracking coordinate system and the optical tracking coordinate system and constructing an error field of the magnetic tracking system and error correction and validation. The coordinate system of the optical tracking system is employed as the "ground truth". The error in Position error and orientation error can be expressed as 3D vectors. The publication to Wu et directs to two method to express the 3D error vectors in space. One is the KD trees and the other is fitting Bernstein polynomials. According to the publication to Wu et al, the magnetic field distortion can be characterized by a Bernstein polynomial of the fourth order.

European patent 2 535 021 to Ophir et al directs to a system for mapping a magnetic field in a volume of interest which includes a magnetic field transmitter, a freestanding magnetic field detector and a processor. The processor is coupled with the magnetic field detector. The magnetic field transmitter generates a magnetic field in the volume of interest. The freestanding magnetic field detector is operative to freely move within the volume of interest. The freestanding magnetic field detector acquires measurements of the flux of the magnetic field at a plurality of poses. The processor estimates theses poses employing a stored generic magnetic field model. The processor re-estimates parameters characterizing the magnetic field model according to deviations between the measurements of the magnetic field and according to predictions of the flux. The predictions are determined according to a stored generic magnetic field model related to the environment. Thereby the processor estimates a new magnetic field model. In the system directed to by Ophir et al, the number of the generators times the number of the sensors is larger than the number of degrees of freedom required to track an object in the volume of interest. This provides additional information relating to the deviations between the magnetic field predicted by the stored magnetic field model and the measurements of the flux of the magnetic field. The processor employs the additional information when re-estimating the parameters characterizing the magnetic field model.

SUMMARY OF THE PRESENT DISCLOSED TECHNIQUE

It is an object of the disclosed technique to provide a novel system and method for mapping a magnetic field by freely moving a magnetic field detector within a volume of interest.

In accordance with the disclosed technique, there is thus provided a system for mapping a magnetic field in a volume of interest. The system includes a magnetic field transmitter, at least one freestanding magnetic field detector, at least one pose information acquisition module and a processor. The processor is coupled with the magnetic field detector and with the at least one pose information acquisition module. The magnetic field transmitter generates a magnetic field in the volume of interest. The at least one freestanding magnetic field detector, is operative to freely move within the volume of interest and to acquire. The at least one freestanding magnetic field detector acquires measurements of the flux of the magnetic field at a plurality of poses. The at least one pose information acquisition module measures information related to the pose of the freestanding magnetic field detector. The processor determines pose related information respective of at least a portion of the measurements of the flux of the magnetic field according to the information related to the pose of the freestanding magnetic field detector, measured by the at least one pose information acquisition module. The processor estimates the entire set of parameters of a magnetic field model template according to the magnetic field flux measurement and the respective pose related information thereof. The processor incorporates the entire set of parameters into the magnetic field model template, thereby determining the magnetic field model. The entire set of parameters includes the coefficients of the magnetic field model, the order of the magnetic field model, the number of the centers of expansion and the locations of the centers of expansion of the magnetic field model.

In accordance with the disclosed technique, there is thus provided a method for mapping a magnetic field in a volume of interest. The method includes the procedures of freely moving a magnetic field detector within the determined volume of interest, acquiring measurements of the magnetic field flux at a plurality of poses of the freestanding magnetic field detector within the volume of interest and determining pose related information respective of at least a portion of the measurement of magnetic field flux. The method further includes the procedure of estimating the entire set of parameters characterizing the magnetic field model according to the magnetic field flux measurements and the respective positions and orientations thereof. The entire set of parameters includes the coefficients of the magnetic field model, the order of the magnetic field model, the number of the centers of expansion and the locations of the centers of expansion of the magnetic field model.

BRIEF DESCRIPTION OF THE DRAWINGS

The disclosed technique will be understood and appreciated more fully from the following detailed description taken in conjunction with the drawings in which:

FIG. 5A is a schematic illustration of a mapping handle and a magnetic field detector constructed and operative in accordance with a further embodiment of the disclosed technique;

FIG. 5B is a schematic illustration of a mapping handle and a magnetic field detector constructed and operative in accordance with another embodiment of the disclosed technique;

FIG. 5C is a schematic illustration of a mapping handle and a magnetic field detector constructed and operative in accordance with a further embodiment of the disclosed technique;

FIG. 5D is a schematic illustration of a mapping handle and a magnetic field detector constructed and operative in accordance with another embodiment of the disclosed technique;

FIG. 5E is a schematic illustration of a mapping handle and a magnetic field detector constructed and operative in accordance with a further embodiment of the disclosed technique;

DETAILED DESCRIPTION OF THE EMBODIMENTS

Figure 1:
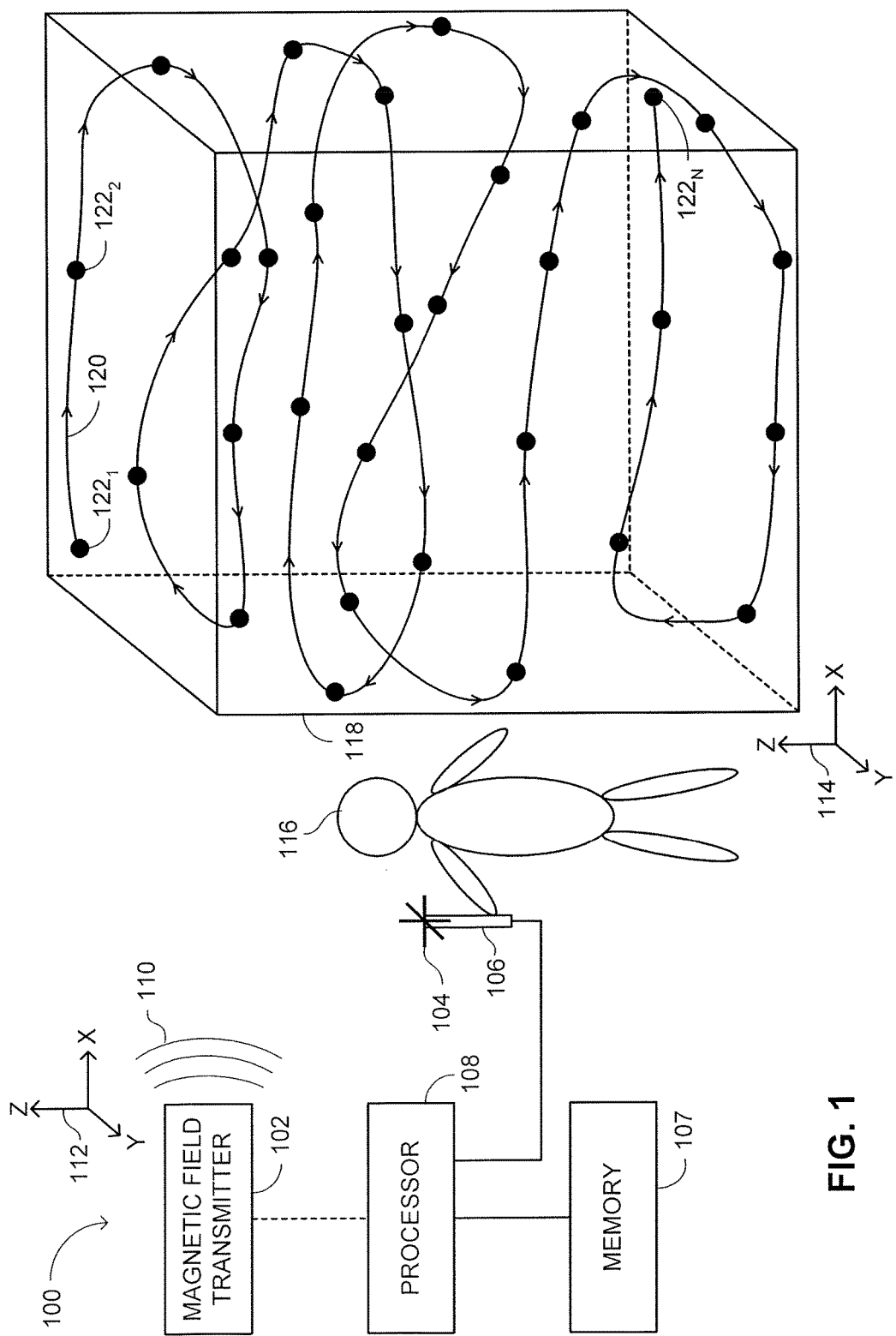
FIG. 1 is a schematic illustration of a system for mapping a magnetic field in a volume of interest, constructed and operative in accordance with an embodiment of the disclosed technique.

The disclosed technique overcomes the disadvantages of the prior art by providing a method and a system for mapping a magnetic field and thus determining the parameters characterizing a magnetic field model by freely moving a magnetic field detector within the volume of interest. According to the disclosed technique a magnetic field detector is mounted on a freestanding mapping handle. Thus, the magnetic field detector is also freestanding. A magnetic field transmitter is activated and produces a magnetic field in the volume of interest. An operator moves the mapping handle in the volume of interest. The detector measures the magnetic field during the movement of the mapping handle. A processor estimates the parameters characterizing the magnetic field model according to the measurements of the magnetic field.

According to one embodiment of the disclosed technique, the operator freely moves the mapping handle, and thus the magnetic field detector, randomly through the volume of interest. According to another embodiment of the disclosed technique, the operator is guided to freely move the mapping handle to a plurality of mapping regions within the volume (e.g., audio instructions or visual instructions such as a display showing the volume of interest with representations of the regions marked on the display). The term "freely moves" refers to herein to unconstraint movement of the mapping handle (i.e., the trajectory of mapping handle, from one pose in the volume of interest to another pose in the volume of interest, has no constraints thereupon). Alternatively, the magnetic field detector may be mounted on a mechanical support such as a mechanical arm capable of freely moving the magnetic field detector through a plurality of poses (i.e., locations or orientation or both) within the volume of interest.

The poses of the detector, relative to the reference coordinate system, at the mapping regions, may be unknown. According to a further embodiment, the system according to the disclosed technique determines the pose of the detector relative to the coordinate system by optically tracking the pose (i.e., location or orientation or both) of the detector. According to another alternative, the magnetic field detector is placed in known poses relative to the reference coordinate system. The processor estimates the poses of the detector relative to the magnetic coordinate system. Alternatively, the poses of the detector, relative to the reference coordinate system, at the mapping regions, may be partially known. For example, when only the locations of the detector are known, then, the system according to the disclosed technique determines only the orientations of the detector in the reference coordinate system. When only the orientations of the detector are known, then, the system according to the disclosed technique determines only the locations of the detector in the reference coordinate system.

According to another embodiment of the disclosed technique, at least one additional tracking system (e.g. an optical tracker, an inertial tracker, an ultrasound tracker, mechanical tracker or any combination thereof), provides additional information relating to the pose of the mapping handle and thus of the magnetic field detector. This additional information may be employed as constraints when estimating the parameters characterizing the magnetic field model. The additional tracking system determines information relating to the pose of the magnetic field detector at a portion of the magnetic field flux measurements. Thus, a portion of the magnetic field flux measurements are associated with respective pose related information. The pose related information, respective of the portion of magnetic field flux measurement may include information relating to only the selected pose related parameters (i.e., selected location coordinates or selected orientation angles or a selected combination of location coordinates and orientation angles) at each of the portion or magnetic field flux measurements. Additionally or alternatively, the information relating to the pose of the magnetic field flux measurement may include information relating to a set of locations or a set of orientations or a set of combinations of location and orientation. Furthermore, each selected magnetic field flux measurement may be associated with different respective pose related information. For example, one measurement is associated only with location while another measurement is associated only with orientation. The system estimates the magnetic field model according to the magnetic field flux measurements and the poses related information respective of the portion of magnetic field flux measurements. It is noted that the magnetic field flux measurements with no respective pose related information or with partial respective pose related information are also employed when estimating the magnetic field model. Furthermore, no prior knowledge regarding the magnetic field model is required only of a magnetic field model template.

Reference is now made to FIG. 1, which is a schematic illustration of a system, generally referenced 100, for mapping a magnetic field in a volume of interest, constructed and operative in accordance with an embodiment of the disclosed technique. System 100 includes a magnetic field transmitter 102, a magnetic field detector 104, a freestanding mapping handle 106, a memory 107 and a processor 108. Magnetic field transmitter 102 includes one or more (e.g., three) magnetic field generators (e.g., coils with electric current flowing there through—not shown). Each magnetic field generator generates a magnetic field which is uniquely identifiable (e.g., each magnetic field has a unique frequency and the fields are transmitted at substantially the same time or, each magnetic field is generated at a different time). Magnetic field detector 104 includes one or more (e.g., three) magnetic field sensors (e.g., coils with electric current induced therein, hall-effect sensors). In general, for the purpose of mapping a magnetic field, the number of magnetic field sensors in the magnetic field detector times the number of magnetic field generators in the magnetic field transmitter must be larger than the number of degrees of freedom required to track the object. For example, for six degrees of freedom, three for location and three for orientation, the number of magnetic field sensors in magnetic field detector 104, times the number of magnetic field generators in magnetic field transmitter 102, must be larger than six (e.g., nine). Thus, system 100 acquires additional information relating to the deviations between the magnetic field flux predicted by the magnetic field model, and the magnetic field flux measured by magnetic field detector 104. This information is related to the parameters of the magnetic field model. For example, when employing three sensors and three magnetic field transmitters, there are more generator detector pairs than there are pose parameters, which define an over-determined set of equations (i.e., there are more equations than there are unknown). Furthermore, the known relative orientation between the magnetic field sensors introduces additional constraints on the determined pose of magnetic field detector 104 during the mapping process. These constraints are introduced to the set of equations when estimating the magnetic field model.

Processor 108 is coupled with memory 107 and with magnetic field detector 104. Processor 108 is, optionally, further coupled with magnetic field transmitter 102 (i.e., magnetic field transmitter 102 may operate independently of processor 108). When processor 108 is not coupled with magnetic field transmitter 102, then processor 108 requires information regarding the operation of magnetic field transmitter 102 (e.g., transmission frequency, transmission power, duty cycle and the like). Magnetic field detector 104 is firmly coupled with freestanding mapping handle 106. Thus, magnetic field detector 104 is also freestanding. Magnetic field transmitter 102, and thus magnetic field 110 are associated with a magnetic coordinate system 112. Memory 107 stores a magnetic field model. Volume of interest 118 is associated with a reference coordinate system 114.

Magnetic field transmitter 102 generates a magnetic field 110 toward a volume of interest 118. An operator 116 holds freestanding mapping handle 106 in her hand. Operator 116 freely moves freestanding mapping handle 106 (i.e., the trajectory of the mapping handle 106, from one pose in the volume of interest to another pose in the volume of interest, has no constraints thereupon) through volume of interest 118, to acquire a sufficient amount of samples, for a required degree of accuracy of the magnetic field model. Thus, magnetic field detector 104 freely moves within volume of interest 118 at a random trajectory 120. When operator 116 freely moves freestanding mapping handle 106 through volume of interest 118, magnetic field detector 104 measures the magnetic flux at a plurality of poses $122_1$-$122_N$ (i.e., either a plurality of locations or a plurality of orientation or both) and stores these measurements in memory 107. Processor 108 determines the magnetic field vectors corresponding to each of poses $122_1$-$122_N$, according to the measurements of the magnetic field flux. Processor 108, estimates poses $122_1$-$122_N$ of magnetic field detector 104 relative to magnetic coordinate system 112, according to the determined corresponding magnetic field vectors.

When no previous model of the magnetic field exists, processor 108 estimates poses $122_1$-$122_N$ relative to magnetic coordinate system 112, according to a generic model of magnetic field 110 (e.g., a model of one or more magnetic dipoles with guessed or heuristically determined parameters) stored in memory 107. Processor 108 uses these pose estimations to estimate the parameters characterizing the magnetic field model of magnetic field 110. Processor 108 estimates the parameters characterizing the magnetic field model according to deviations between the measurements of the magnetic field flux and predictions of the magnetic field flux, at the estimated poses, determined according to the stored magnetic field model (i.e., either the generic model or a previously estimated magnetic field that is stored in memory 107). Thus, processor 108 estimates a new magnetic field model and stores this new model in memory 107 instead of the previous model. Processor 108 may use the new estimated magnetic field model to re-estimate the poses $122_1$-$122_N$ (i.e., relative to magnetic coordinate system 112) of magnetic field detector 104 and use these re-estimated poses to re-estimate the parameters characterizing the magnetic field model. Processor 108 may repeat this iterative process for a predetermined number of times or until a desired degree of accuracy is achieved. Processor 108 stores the estimated parameters in memory 107. Estimating the parameters of a magnetic field model is further explained herein below, in conjunction with FIG. 7. Furthermore, processor 108 registers magnetic coordinate system 112 with a reference coordinate system 114. Thus, each pose (i.e., location or orientation or both) in magnetic coordinate system 112 has a corresponding pose in reference coordinate system 114. Registering a magnetic coordinate system with a reference coordinate system is further explained in conjunction with FIG. 4.

Alternatively, processor 108 estimates the magnetic field model according to deviations between the values of parameters measured in each sensor or magnetic field detector (e.g., the amplitude, frequency and phase of the magnetic field) and the values of the same parameters predicted by magnetic field model stored in memory 107. It is noted that processor 108 does not necessarily estimates the pose of magnetic field detector 104 according to the model, only the relevant parameters.

According to another embodiment, the system according to the disclosed technique guides the operator through a plurality of mapping regions within the volume of interest. The system may guide the operator, for example, by audio signals (e.g., sounds corresponding to directions, synthesized words). The system may guide the operator visually (e.g., a display displaying representations of the mapping regions and the freestanding mapping handle thereon or by displaying arrows directing an operator to move the mapping handle in a selected direction).

Figure 2:
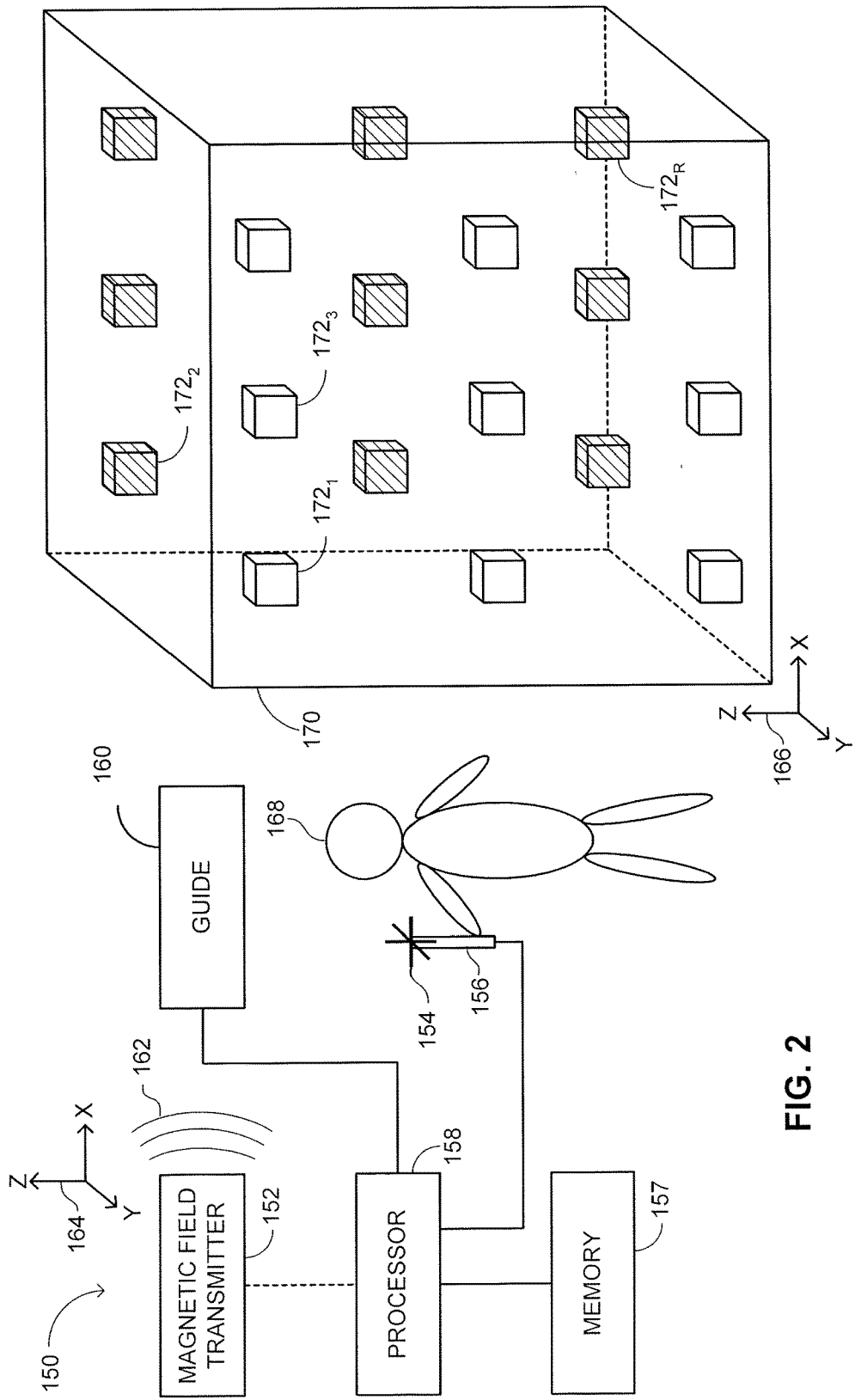
FIG. 2 is a schematic illustration of a system for mapping a magnetic field in a volume of interest, constructed and operative in accordance with another embodiment of the disclosed technique.

Reference is now made to FIG. 2, which is a schematic illustration of a system, generally referenced 150, for mapping a magnetic field in a volume of interest, constructed and operative in accordance with another embodiment of the disclosed technique. System 150 includes a magnetic field transmitter 152, a magnetic field detector 154, a freestanding mapping handle 156, a processor 158, a memory 157 and a guide 160. Magnetic field transmitter 152 includes one or more (e.g., three) magnetic field generators (e.g., coils with electric current flowing there through—not shown). Each magnetic field generator generates a magnetic field which is uniquely identifiable (e.g., each magnetic field has a unique frequency or each magnetic field is generated at a different time). Magnetic field detector 154 includes one or more (e.g., three) magnetic field sensors (e.g., coils with electric current induced therein, hall-effect sensors). For the purpose of mapping a magnetic field, the number of magnetic field sensors in magnetic field detector 154 times the number of magnetic field generators in magnetic field transmitter 152 must be larger than the number of degrees of freedom required for tracking the object. Guide 160 may be a loudspeaker sounding audio signals or a display displaying representations of the volume of interest 170 and freestanding mapping handle 156 (e.g., a two dimensional or a three dimensional representation).

Processor 158 is coupled with magnetic field detector 154, with memory 157 and with guide 160. Processor 158 is, optionally, further coupled with magnetic field transmitter 152 (i.e., magnetic field transmitter 152 may operate independently of processor 158). When processor 158 is not coupled with magnetic field transmitter 152, then processor 158 requires information regarding the operation of magnetic field transmitter 152 (e.g., transmission frequency, transmission power, duty cycle and the like). Magnetic field detector 154 is firmly coupled with freestanding mapping handle 156. Thus, magnetic field detector 154 is also freestanding. Magnetic field transmitter 152, and thus magnetic field 162 are associated with a magnetic coordinate system 164. Memory 157 stores a magnetic field model. Volume of interest 170 is associated with a volume coordinate system 166.

Magnetic field transmitter 152 generates a magnetic field 162 toward volume of interest 170. An operator 168 holds freestanding mapping handle 156 in his hand. Guide 160 guides the operator 168 to freely move mapping handle 156 (i.e., the trajectory of the mapping handle 156, from one pose in the volume of interest to another pose in the volume of interest, has no constraints thereupon). Thus, magnetic field detector 154 also freely moves within volume of interest 170 through mapping regions $172_1$-$172_R$. Guide 160 guides the operator 168 to freely move freestanding mapping handle 156 at least until magnetic field detector 154 has moved through all the mapping regions $172_1$-$172_R$. Guide 160 guides operator 168, for example, by sounding audio signals corresponding to directions, or sounding synthesized words. Alternatively, guide 160 guides operator 168 visually. For example, guide 160 is a display (e.g., a two dimensional display or a three dimensional display) displaying representations of the mapping regions $172_1$-$172_R$, or a pose related thereto, and freestanding mapping handle 156 thereon. The representations of mapping regions $172_1$-$172_R$ may be deleted from the display, or otherwise marked, when magnetic field detector 154 passes there through. Alternatively, guide 160 displays arrows directing operator 168 to move freestanding mapping handle 156 toward a selected direction.

Magnetic field detector 154 measures the magnetic field vectors at a plurality of regions $172_1$-$172_R$ and stores these measurements in memory 157. As described above, in conjunction with FIG. 1, magnetic field detector 154 measures the magnetic flux at a plurality of pose of magnetic field detector 154 in regions $172_1$-$172_R$. Processor 158 determines the magnetic field vectors corresponding to each pose of magnetic field detector 154, according to the measurements of the magnetic field flux. Processor 158 estimates the poses of magnetic field detector 154, relative to magnetic coordinate system 164, according to the determined corresponding magnetic field vectors.

When no previous model of the magnetic field exists, processor 158 estimates the poses of magnetic field detector 154 relative to magnetic coordinate system 164, according to a generic model of magnetic field 162 stored in memory 157. Processor 158 uses these pose estimations to estimate the parameters characterizing the magnetic field model of magnetic field 162. Processor 158 estimates the parameters characterizing the magnetic field model according to deviations between the measurements of the magnetic field flux and predictions of the magnetic field flux, at the estimated poses, determined according to the stored magnetic field model (i.e., the magnetic field that is stored in memory 157). Thus, processor 158 estimates a new magnetic field model and stores this new model in memory 157 instead of the previous model. Processor 158 may use the new estimated magnetic field model to re-estimate the poses (i.e., relative to magnetic coordinate system 164) of magnetic field detector 154 and uses these re-estimated poses to re-estimate the parameters characterizing the magnetic field model. Processor 158 may repeat this iterative process for a predetermined number of times or until a desired degree of accuracy is achieved. Processor 158 stores the estimated parameters in memory 157.

The freestanding mapping handle may be coupled with a mechanical arm instead of being hand held by an operator. The mechanical arm is capable of freely moving through a plurality of poses within the volume of interest (i.e., the trajectory of the mechanical arm from one pose in the volume of interest to another pose in the volume of interest has no constraints thereupon). Accordingly, the mechanical arm either moves randomly through a plurality of poses within the volume of interest or guide through a plurality of regions of interest within the volume of interest.

Figure 3:
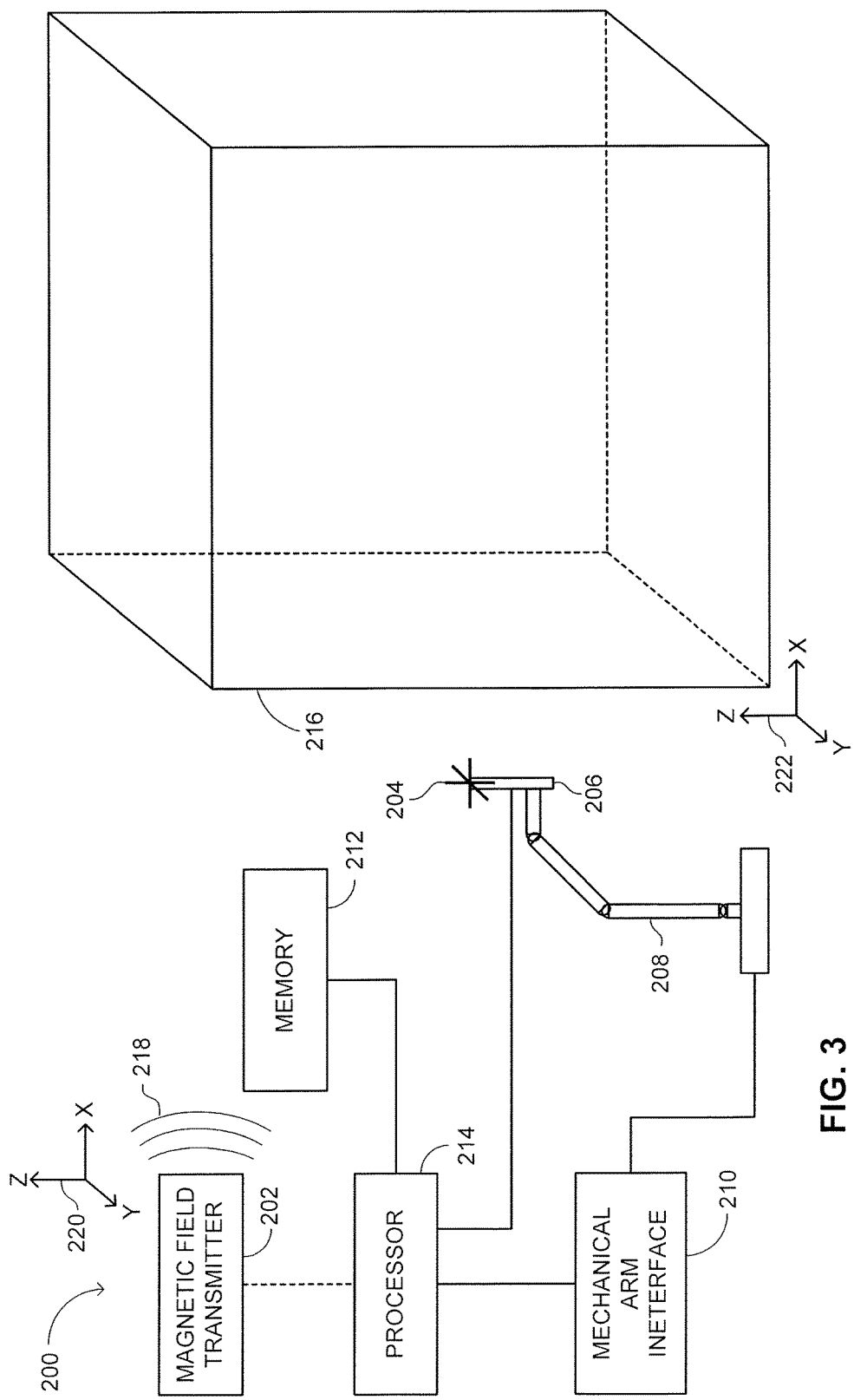
FIG. 3 is a schematic illustration of a system, constructed and operative in accordance with a further embodiment of the disclosed technique.

Reference is now made to FIG. 3, which is a schematic illustration of a system, generally reference 200, constructed and operative in accordance with a further embodiment of the disclosed technique. System 200 includes a magnetic field transmitter 202, a magnetic field detector 204, a mapping handle 206, a mechanical arm 208, a mechanical arm interface 210, a memory 212, and a processor 214. Magnetic field transmitter 202 includes one ore more (e.g., three) magnetic field generators (e.g., three coils with electric current flowing there through—not shown). Each magnetic field generator generates a magnetic field which is uniquely identifiable (e.g., each magnetic field has a unique frequency or each magnetic field is generated at a different time). Magnetic field detector 204 includes one or more (e.g., three) magnetic field sensors (e.g., coils with electric current induced therein, hall-effect sensors). For the purpose of mapping a magnetic field, the number of magnetic field sensors in magnetic field detector 204 times the number of magnetic field generators in the magnetic field transmitter 202 must be larger than the number of degrees of freedom required for tracking the object.

Processor 214 is coupled with memory 212, with magnetic field detector 204, and with mechanical arm interface 210. Processor 214 is, optionally, further coupled with magnetic field transmitter 202 (i.e., magnetic field transmitter 202 may operate independently of processor 214. When processor 214 is not coupled with magnetic field transmitter 202 then processor 214 requires information regarding the operation of magnetic field transmitter 202 (e.g., transmission frequency, transmission power, duty cycle and the like). Magnetic field detector 204 is coupled with mapping handle 206. Mapping handle 206 is coupled with mechanical arm 208. Mechanical arm 208 is coupled with mechanical arm interface 210. Mechanical arm 208 includes a plurality of actuator (not shown) enabling mechanical arm 208 to freely move to a plurality of poses (i.e., locations or orientations or both) within a volume of interest 216. Since mechanical arm 208 freely moves within volume of interest 216 mapping handle 206 and thus magnetic field detector 204 is freestanding. Magnetic field transmitter 202, and thus magnetic field 218 are associated with a magnetic coordinate system 220. Memory 212 stores a magnetic field model. Volume of interest 216 is associated with a volume coordinate system 222.

Magnetic field transmitter 202 generates a magnetic field 218 toward volume of interest 216. Processor 214 directs mechanical arm interface 210 to freely move mechanical arm 208 (i.e., the trajectory of the mechanical arm 208 from one pose in the volume of interest to another pose in the volume of interest has no constraints thereupon) within volume of interest 216 either randomly or to a plurality of regions of interest. Magnetic field detector 204 measures the magnetic flux at a plurality of poses. As described above, in conjunction with FIGS. 1 and 2, processor 214 iteratively estimates the parameters of the magnetic field model by estimating the poses of magnetic field detector 204 and using the poses estimations to estimate the parameters of the magnetic field model. Processor 214 may repeat this iterative process for a predetermined number of times or until a desired degree of accuracy is achieved. Processor 214 stores the estimated parameters in memory 212. It is noted that mechanical arm 208 is brought herein as an example. In generally, any mechanical support capable of moving through a plurality of poses in the volume of interest is suitable. It is noted that mechanical arm 208 may be replaced with any mechanical support capable of moving to a plurality of poses within volume of interest 216. For example, magnetic field detector 204 may be coupled with gimbals, mounted on tracks, capable of rotating in three dimensions and capable of moving in three dimensions.

When a magnetic tracking system according to the disclosed technique tracks the pose of an object in a reference coordinate system (e.g., the coordinate system associated with a cockpit of an aircraft or the coordinate system of an image), the system registers the magnetic coordinate system with the reference coordinate system. In other words, the system determines a correspondence between the poses (i.e., location or orientation or both) relative to the magnetic coordinate system and the poses relative to the reference coordinate system. Thus each pose determined by the magnetic tracking system, relative to the magnetic coordinate system, has a corresponding pose relative to the reference coordinate system. The system may register the magnetic coordinate system with a reference coordinate system for example, by placing the magnetic field detector at a known pose, relative to the reference coordinate system, and determine the pose of the magnetic field detector relative to the magnetic coordinate system. Alternatively, when the pose of the magnetic field transmitter, relative to the reference coordinate system, is known, each pose relative to the magnetic coordinate system is associated with a respective pose relative to the reference coordinate system. Thus, each determined pose of transmitter in the magnetic coordinate system has an associated pose in the reference coordinate system.

According to another embodiment of the disclosed technique, an imager is affixed on the freestanding mapping handle. The camera acquires at least one image of articles having known poses relative to the reference coordinate system. The processor estimates the pose (i.e., as mentioned above, either location or orientation or both) of the magnetic field detector relative to the magnetic coordinate system and the pose of the camera relative to the reference coordinate system. Since the spatial relationship between the camera and the magnetic field detector is known, the processor determines the correspondence between the reference coordinate system and the magnetic coordinate system.

Figure 4:
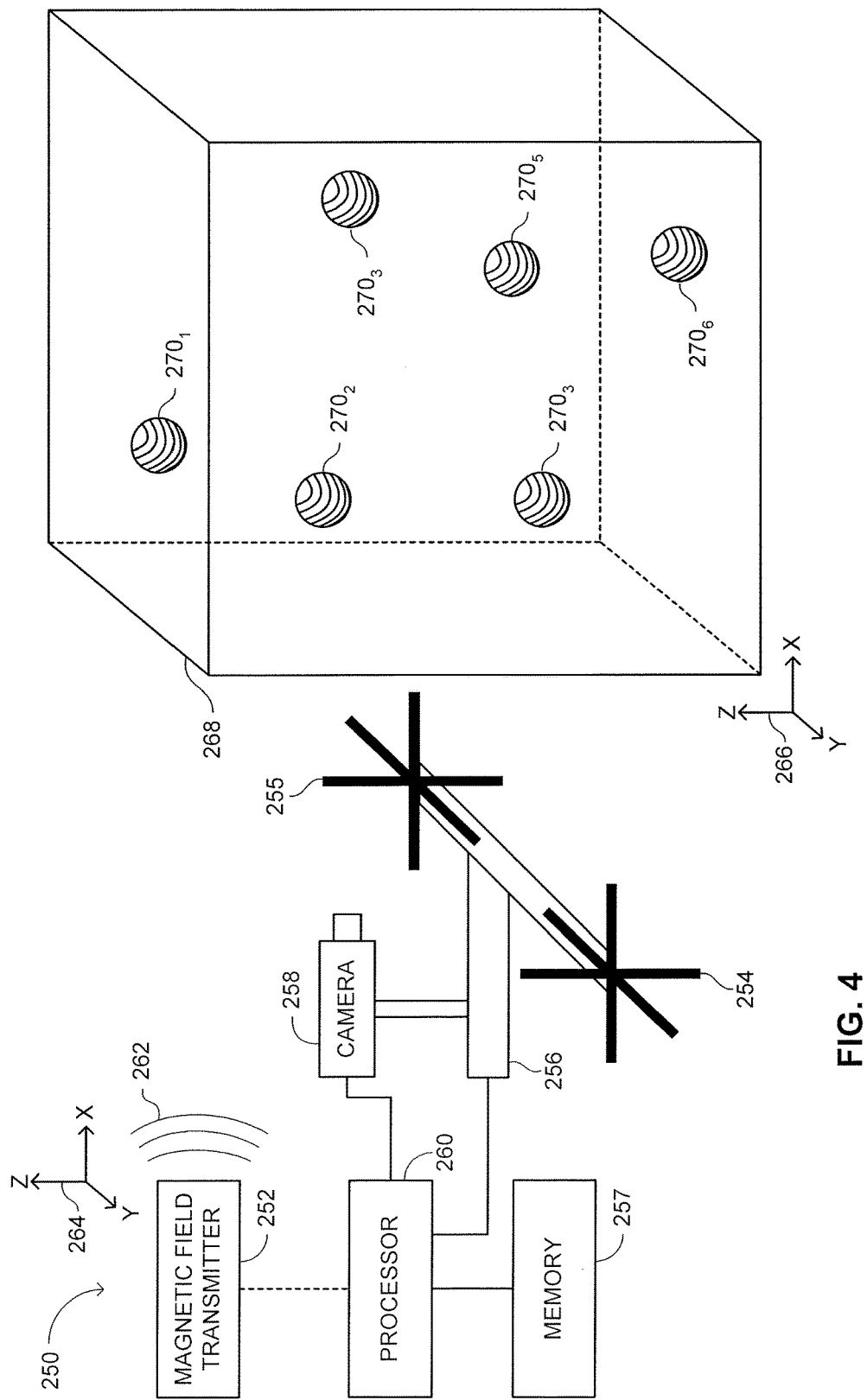
FIG. 4 is a schematic illustration of a system for mapping a magnetic field in a volume of interest, constructed and operative in accordance with another embodiment of the disclosed technique.

Reference is now made to FIG. 4, which is a schematic illustration of a system, generally referenced 250, for mapping a magnetic field in a volume of interest, constructed and operative in accordance with another embodiment of the disclosed technique. System 250 includes a magnetic field transmitter 252, a first magnetic field detector 254, a second magnetic field detector 255, a freestanding mapping handle 256, a memory 257, an imager 258, and a processor 260. System 250 may further include a guide (not shown) similar to the guide 160 described hereinabove conjunction with FIG. 2. Magnetic field transmitter 252 include one ore more (e.g., three) magnetic field generators (e.g., coils with electric current flowing there through—not shown). Each magnetic field generator generates a magnetic field which is uniquely identifiable (e.g., each magnetic field has a unique frequency or each magnetic field is generated at a different time). Each of First magnetic field detector 254 and second magnetic field detector 255 include one or more (e.g., three) magnetic field sensors (e.g., coils with electric current induced therein, hall-effect sensors). As mentioned above, for the purpose of mapping a magnetic field, the total number of magnetic field sensors in first magnetic field detector 254 and second magnetic field detector 255, times the number of magnetic field generators in magnetic field transmitter 252, must be larger than the number of degrees of freedom required for tracking the object. Imager 258 may be a camera operating, for example, in the Infrared (IR) spectrum or in the visual spectrum or any other desired spectrum. Imager 258 may further be a medical imager (e.g., X-ray). The spatial relationship (i.e., the relative pose), between first magnetic field detector 254 and second magnetic field detector 255, is known and stored in memory 207.

Processor 260 is coupled with first magnetic field detector 254 and with second magnetic field detector 254, with memory 257 and with imager 258. Processor 260 is, optionally, further coupled with magnetic field transmitter 252 (i.e., magnetic field transmitter 252 may operate independently of processor 260). When system 250 includes a guide, the guide is also coupled with processor 260. First magnetic field detector 254, second magnetic field detector 255 and camera 258 are firmly coupled with freestanding mapping handle 256. Thus, first magnetic field detector 254, second magnetic field detector 255 and imager 258 are also freestanding. Magnetic field transmitter 252, and thus magnetic field 262 are associated with a magnetic coordinate system 264. Memory 257 stores a magnetic field model. Volume of interest 268 is associated with a reference coordinate system 266.

Magnetic field transmitter 252 generates a magnetic field 262 toward a volume of interest 268. An operator (not shown) holds freestanding mapping handle 256 in her hand. The operator freely moves freestanding mapping handle 256 (i.e., the trajectory of the mapping handle 256, from one pose in the volume of interest to another pose in the volume of interest, has no constraints thereupon), and thus first magnetic field detector 254, second magnetic field detector 255 and imager 258 within volume of interest 268. First magnetic field detector 254 and second magnetic field detector 255 measure the magnetic flux at a plurality of poses (i.e., locations or orientations or both). Processor 260 determines the magnetic field vector corresponding to each pose according to the measurements of the magnetic field flux. Processor 260 estimates the poses of first magnetic field 254 and second magnetic field detector 255, relative to magnetic coordinate system 264, according to the determined corresponding magnetic field vectors. Thus, processor 260 estimates the pose of mapping handle 256 and consequently of imager 258. Since the spatial relationship between first magnetic field detector 254 and second magnetic field 255 is known, the pose estimates of first magnetic field detector 254 and second magnetic field detector 255 must comply (i.e., within a determined degree of accuracy) with the known relative pose, between first magnetic field detector 254 and second magnetic field detector 255 (i.e. due to the firm coupling of first magnetic field detector 254 and second magnetic field detector 255 with freestanding mapping handle 256). In other words, the known relative pose, between first magnetic field detector 254 and second magnetic field detector 255, introduces constraints to the pose estimations thereof. These added constraints improve the accuracy of the estimated poses. Processor 260 estimates the parameters characterizing the magnetic field model. Processor 260 stores the estimated parameters in memory 257.

When no previous model of the magnetic field exist, processor 260 estimates the poses of first magnetic field detector 254 and second magnetic field detector 255 relative to magnetic coordinate system 264, according to a generic model of magnetic field 262 (e.g., a model of one or more magnetic dipoles) stored in memory 257. Processor 260 uses these pose estimations to estimate the parameters characterizing the magnetic field model of magnetic field 262. Processor 260 estimates the parameters characterizing the magnetic field model according to deviations between the measurements of the magnetic field flux and predictions of the magnetic field flux, at the estimated poses (i.e., locations or orientations or both), determined according to the stored magnetic field model (i.e., the magnetic field that is stored in memory 257). Thus, processor 260 estimates a new magnetic field model and stores this new model in memory 257 instead of the previous model. Processor 260 may use the new estimated magnetic field model to re-estimate the poses of first magnetic field detector 254 and second magnetic field detector 255 (i.e., relative to magnetic coordinate system 264) and use these re-estimated poses to re-estimate the parameters characterizing the magnetic field model. Processor 260 may repeat this iterative process for a predetermined number of times or until a desired degree of accuracy is achieved. Processor 260 stores the estimated parameters in memory 257.

Prior, during or after the estimation of the magnetic field model, imager 258 acquires an image of articles $270_1$, $270_2$, $270_3$, $270_4$, $270_5$ and $270_6$ and provides this acquired image to processor 260. Memory 257 stores the poses of articles $270_1$-$270_6$, relative to reference coordinate system 266. Processor 260 determines the pose of imager 258 and thus, the pose of mapping handle 256, first magnetic field detector 254 and second magnetic field detector 256, relative to reference coordinate system 266, according to the acquired image of articles $270_1$-$270_6$ (i.e., since imager 258, first magnetic field detector 254 and second magnetic field detector 256 are all firmly coupled with freestanding mapping handle 256).

The number of articles $270_1$-$270_6$ (i.e., six) is brought herein as an example. It is noted that articles $270_1$-$270_6$ are optically detectable articles that may typically exist in volume of interest 268 (e.g., boresight reference unit placed closed to detectable volume). Alternatively, articles $270_1$-$270_6$ may be optically detectable articles specially placed in volume of interest 268 (e.g., fiducials or Light Emitting Diodes emitting light in the IR or visual spectrums). The term optically detectable articles relates herein to articles that either emit or reflect light in the operating spectrum of imager 258. It is noted that articles $270_1$-$270_6$ may exhibit no rotational symmetry or partial rotational symmetry. Thus, processor 260 can determine the azimuth the elevation and the roll angles of imager 258, relative to the reference coordinate system, according to an image of one article only.

Alternatively, mapping handle 256 may be coupled with a mechanical arm (not shown) such as mechanical arm 208 (FIG. 3). The mechanical arm interface provides processor 260 with information regarding the pose of the tip of mechanical arm relative to reference coordinate system 226 (e.g., according to the pose of the base of mechanical arm 208 the geometry of mechanical arm 208 and the state of the actuators of mechanical arm 208). Thus, processor 260 determines the pose of magnetic field detector 254 relative to reference coordinated system 266.

Magnetic field detector 254 measures the magnetic field flux. Processor 260 determines, accordingly, the pose of magnetic field detector 254, relative to magnetic coordinate system 264. Since processor 264 determines the pose of magnetic field detector 254 relative to both reference coordinate system 266 and magnetic coordinate system 264 processor 260 therefore, determines the correspondence between reference coordinate system 266 and magnetic coordinate system 264. Thus, processor 260 registers reference coordinate system 266 with magnetic coordinate system 264.

In general, processor 260 registers the magnetic coordinated system with the reference coordinate system, by determining the pose (i.e., location or orientation or both) of the magnetic field detector in the reference coordinate system. Accordingly, for example, processor 260 determines the orientation of magnetic field detectors 254 and 255 in reference coordinate system 222, according to the following set of equations represented in matrix from:

$$[\text{HRPToDRPPos}]\cdot[\text{DRPPos}]\cdot[\text{ModelPos}]=[\text{HRPPos}] \quad (1)$$

Equation (1) relates to registration of orientation only. A similar equation may be used for registering the location of first and second magnetic field detectors 254 and 255 in reference coordinate system 222. In equation (1), HRPToDRPPos denotes relative pose between a Handle Reference Point (HRP, not show) and a Detector Reference Point (DRP, also not shown). HRP is a point on mapping handle 256 according to which the pose of mapping handle 256, in reference coordinate system 266, is determined. DRP is a point on mapping handle 256 with known relative pose between the DRP and each of first and second magnetic field detectors 254 and 255 (i.e., the DRP may be one of magnetic field detectors 254 or 255 since the relative pose between magnetic field detector 254 and 255 is known). DRPPos denotes the pose of the DRP in magnetic coordinate system 264 and is determined according to the measurements made by first and second magnetic field detectors 254 and 255. ModelPos denotes the transformation between magnetic coordinate system 264 and the reference coordinate system 266. HRPPos denotes the pose of the HRP in reference coordinate system 266 and is determined according to the images acquired by imager 258. The symbol '·' denotes matrix multiplication.

Processor 256 determines HRPPos according to images of articles $270_1$, $270_2$, $270_3$, $270_4$, $270_5$, $270_6$, (i.e., located in volume of interest 266), acquired by imager 258. Imager 258 is affixed to the mapping handle at a known relative pose to the HRP. Alternatively, imager 258 may be affixed in volume of interest 268. Thus, the pose of imager 258 in reference coordinate system 222 is also known. Processor 256 determines HRPPos according to images, acquired by imager 258, of articles (not shown) located on mapping handle 256 with a known relative pose to the HRP. The articles on mapping handle 256 are optically detectable articles that may typically exist on mapping handle 256 (e.g., the tip thereof). Alternatively, the articles on mapping handle 256 may be optically detectable articles specially placed on mapping handle 256 (e.g., fiducials or Light Emitting Diodes—LEDs).

When HRPToDRPPos is known, processor 260 determines ModelPos only (i.e., since HRPPos is determined according to the images acquired by the imager), and only one article is needed (i.e. this article exhibits no rotational symmetry or partial rotational symmetry such as a crosshair, enabling processor 260 to determine the three orientation angles). When HRPToDRPPos is unknown, processor 260 determines HRPToDRPPos as well and a minimum of three articles are needed. In general, Equation (1) is a non-linear set of equations which can be solved, for example, according to the Newton-Raphson Method.

Reference is now made to FIG. 5A which is a schematic illustration of a mapping handle, generally reference 300 and a magnetic field detector, generally referenced 302, constructed and operative in accordance with another embodiment of the disclosed technique. Magnetic field detector 302 includes one magnetic field sensor 304 (e.g., a coil). Magnetic field detector 302 is coupled with mapping handle 300. As mentioned above, in general, the number of magnetic field generators times the number of sensors should be larger than the number of required location and orientation parameters. Therefore, to map the magnetic field and determine the parameters of a magnetic field model, used to determine both location and orientation of a tracked object, a magnetic field transmitter which includes at least seven magnetic field generators is required. Thus, there are more generator detector pairs than there are pose parameters, which define an over-determined set of equations (i.e., there are more equations than there are unknowns). Therefore, this set of equations includes additional information relating to the deviations between the magnetic field predicted by the magnetic field model and the magnetic field measured by magnetic field detector 302.

Reference is now made to FIG. 5B which is a schematic illustration of a mapping handle, generally reference 310 and a magnetic field detector, generally referenced 312, constructed and operative in accordance with a further embodiment of the disclosed technique. Magnetic field detector 312 includes two magnetic field sensors 314 and 316. Magnetic field detector 312 is coupled with mapping handle 310. To map the magnetic field and determine the parameters of a magnetic field model a magnetic field transmitter which employs at least four magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detector 312.

Reference is now made to FIG. 5C which is a schematic illustration of a mapping handle, generally reference 320 and a magnetic field detector, generally referenced 322, constructed and operative in accordance with a further embodiment of the disclosed technique. Magnetic field detector 322 includes three magnetic field sensors 324, 326 and 328. Magnetic field detector 322 is coupled with mapping handle 320. To map the magnetic field and determine the parameters of a magnetic field model a magnetic field transmitter which employs at least three magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detector 322. Furthermore, the known relative orientation between magnetic field sensor 324, 326 and 328 introduces additional constraints to the determined pose of magnetic field detector 322 during the mapping process. Thus, three transmitters and two of the sensors (e.g., sensor 324 and sensor 326) may be employed for determining the pose of detector 322 and thus of sensor 328. These deviations may be employed to update the parameters of the magnetic field model.

Reference is now made to FIG. 5D which is a schematic illustration of a mapping handle, generally reference 330 and two magnetic field detector, generally referenced 332 and 334, constructed and operative in accordance with another embodiment of the disclosed technique. Each of magnetic field detectors 332 and 334 include one magnetic field sensor 336 and 338 respectively. Each of magnetic field detectors 335 and 334 is coupled with mapping handle 300. The spatial relationship (i.e., the relative location and orientation), between magnetic field detector 332 and magnetic field detector 334, is known. Therefore, to map the magnetic field and determine the parameters of a magnetic field model a magnetic field transmitter which employs at least four magnetic field generators are required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detectors 332 and 334. Furthermore, the known spatial relationship (i.e., relative location and orientation) between magnetic field detectors 332 and 334 introduces additional constraints on the determined poses of magnetic field detectors 332 and 334 during the mapping process. These constraints may be employed to update the parameters of the magnetic field model.

Reference is now made to FIG. 5E which is a schematic illustration of a mapping handle, generally reference 340 and two magnetic field detectors, generally referenced 342 and 344, constructed and operative in accordance with another embodiment of the disclosed technique. Each of magnetic field detectors 342 and 344 include three magnetic field sensors. Magnetic field detector 342 includes magnetic field sensors 346, 348 and 350. Magnetic field detector 344 includes magnetic field sensors 352, 356 and 354. Each of magnetic field detectors 342 and 344 is coupled with mapping handle 340. The spatial relationship (i.e., the relative location and orientation), between magnetic field detector 342 and magnetic field detector 344, is known. To map the magnetic field and determine the parameters of a magnetic field model a magnetic field transmitter which employs at least two magnetic field generators is required. Thus, there are more generator detector pairs than there are pose parameters, which define an over-determined set of equations (i.e., there are more equations than there are unknown). Therefore, this set of equations includes additional information relating to the deviations between the magnetic field predicted by the magnetic field model and the magnetic field measured by magnetic field detectors 342 and 344. Furthermore, the known spatial relationship between magnetic field detectors 342 and 344 introduces additional constraints on the determined poses of magnetic field detectors 342 and 344 during the mapping process. These constraints may be employed to update the parameters of the magnetic field model.

Figure 6:
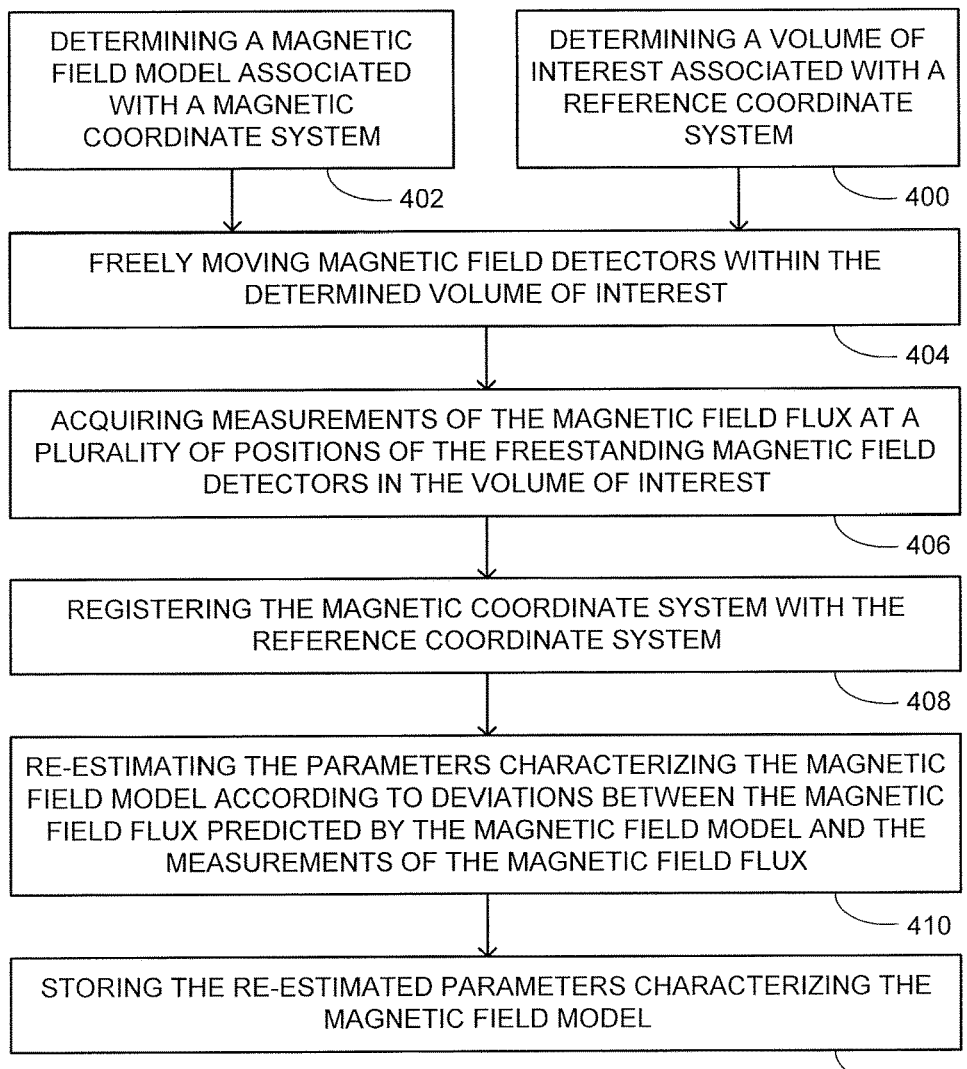
FIG. 6 is a schematic illustration of a method for mapping a magnetic field in accordance with another embodiment of the disclosed technique.

Reference is now made to FIG. 6, which is a schematic illustration of a method for mapping a magnetic field in accordance with another embodiment of the disclosed technique. In procedure 400, a volume of interest is determined. The volume of interest is associated with a reference coordinate system. For example, the volume of interest is a cockpit of an aircraft. The volume of interest may further be the body of a patient or a room.

In procedure 402, a magnetic field models is determined. The magnetic field model is associated with a magnetic coordinate system. This model may be a physical model or a mathematical model. The magnetic field model includes parameters characterizing the model. In general, when the model is a physical model, the parameters are physical parameters of the magnetic field. With reference to FIG. 1, memory 107, stores the parameters characterizing the determined magnetic field model.

In procedure 404, magnetic field detectors are freely moved within the determined volume of interest. The magnetic field detectors may be moved in the volume of interest at a random trajectory. Alternatively, the magnetic field detectors may be freely guided towards regions of interest within the volume of interest. With reference to FIG. 1, operator 116 freely moves first magnetic field detector 104 and second magnetic field detector 104 within volume of interest 118 in a random trajectory 120. With reference to FIG. 2, guide 160 guides operator 168 to freely move magnetic field detector 154 through regions of interest $172_1$-$172_R$. With reference to FIG. 3, mechanical arm interface 210 directs mechanical arm 208 to freely move within volume of interests either at a random trajectory or through a plurality of regions of interest.

In procedure 406, measurements of the magnetic field flux, at a plurality of poses in the volume of interest, are acquired. When the magnetic field detector is moved in a random trajectory in the volume of interest, then, the measurements of the magnetic field flux are acquired at a plurality of poses on the random trajectory. When the magnetic field detector is guided toward regions of interest in the volume of interest, then, the measurements of the magnetic field flux are acquired at a plurality of poses in the regions of interest. With reference to FIG. 1, magnetic field detector 104 acquires measurements of the magnetic field flux at a plurality of poses $122_1$-$122_N$ on trajectory 120. With reference to FIG. 2, magnetic field detector 154 acquires measurements of the magnetic field flux at a plurality of poses in regions $172_1$-$172_R$.

In procedure 408 the magnetic field coordinate system is registered with the reference coordinate system. Reference coordinate system is registered with the magnetic coordinate system by optically determining the pose (i.e., location or orientation or both) of a magnetic field detector relative to the reference coordinate system and determining the pose of the magnetic field detector relative to the magnetic coordinate system. When the location of the magnetic field transmitter, in the reference coordinate system is known, reference coordinate system is registered with the magnetic coordinate system by optically determining the orientation of a magnetic field detector in the reference coordinate system. It is noted that registering the magnetic field coordinate system with the reference coordinate system may be performed either prior, during or after the procedure of acquiring measurements of the magnetic field flux. When using the poses determined according to the imagers acquired by the imager as constraint on the poses determined according to the measurements of the magnetic field detector, then, the imager acquires the images before the magnetic field model estimation. With reference to FIG. 4, processor 260 determines the pose of first magnetic field detector 254 and second magnetic field detector 255 relative to magnetic coordinate system 264 according to the measurements of the magnetic flux in first magnetic field detector 254 and second magnetic field detector 255. Processor 260 determines the pose of first magnetic field detector 254 and second magnetic field detector 255 relative to reference coordinate system 266 according to an image of article $270_1$-$270_6$ acquired by imager 258.

In procedure 410, the parameters characterizing the magnetic field model are re-estimated according to deviations between the magnetic field flux predicted by the magnetic field model and the measurements of the magnetic field flux. The parameters are estimated iteratively as further explained below in conjunction with FIG. 7. It is noted that when the magnetic coordinate system is registered with the reference coordinate system the parameters characterizing the magnetic field model are estimated with reference to the reference coordinate system. However, the parameters characterizing the magnetic field model may be estimated with reference to the magnetic coordinate system or any other coordinate system. The registration between the magnetic or the other coordinate system with the reference coordinate system may be performed at a later stage. It is further noted that, when registration between the reference coordinate system and the magnetic coordinate system is performed during the mapping of the magnetic field, then, the optical pose measurements may be used in conjunction with the magnetic field measurements for mapping the magnetic field (e.g., as constraints on the pose of the magnetic field detector). With reference to FIG. 1, processor 108 estimates the parameters of the magnetic field model according to the measurements of the magnetic field flux.

In procedure 412, the re-estimated parameters, characterizing the magnetic field model, are stored. Thereby, a re-estimated magnetic field model is stored instead of the previously stored magnetic field model. With reference to FIG. 1, processor 108 stores the estimated parameters characterizing the magnetic field model in memory 107.

As mentioned above parameters characterizing the magnetic field may be iteratively estimated according to deviations between the measurements of the magnetic field flux and predictions of the magnetic field flux, at the estimated poses. Accordingly, the poses of the magnetic field detector are estimated according to an initially stored magnetic field model. The parameters characterizing the magnetic field model are estimated according to the estimated poses of the magnetic field detector. The parameters of the magnetic field may be re-estimated using the estimated poses of the magnetic field detector and the previously estimated magnetic field model. This process may be repeated for a predetermined number of times or until a desired degree of accuracy is achieved.

Figure 7:
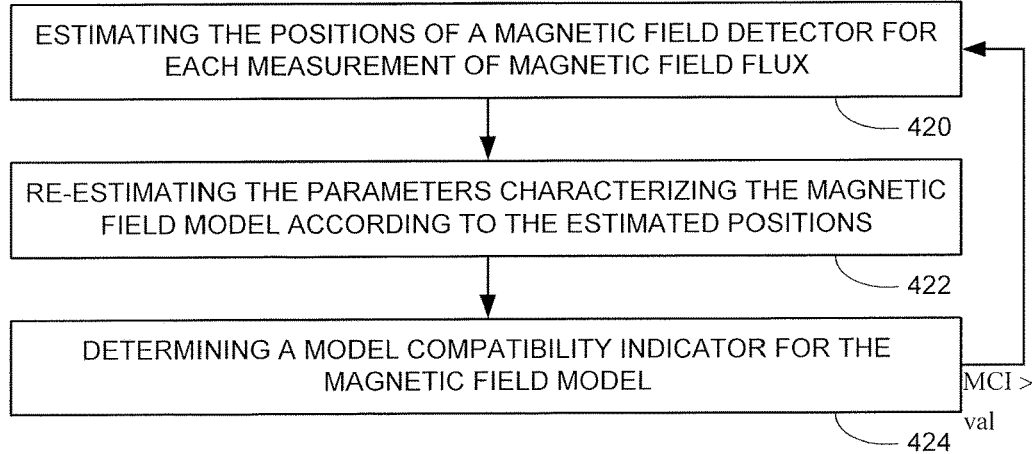
FIG. 7 is a schematic illustration of an exemplary method for estimating the parameters of a magnetic field, in accordance with a further embodiment of the disclosed technique.

Reference is now made to FIG. 7, which is a schematic illustration of an exemplary method for estimating the parameters of a magnetic field, in accordance with a further embodiment of the disclosed technique. In procedure 420, the pose of the magnetic field detector is estimated for each measurement of magnetic field flux according to the stored magnetic field model. The poses of the magnetic field detector, relative to the magnetic coordinate system, are estimated, for example, by minimizing the squared differences between the measurements of the magnetic field flux and predictions of the magnetic field flux (i.e., predicted by the stored magnetic field model). This is stated mathematically as follows:

$$\underset{\overline{P}, \overline{O}}{\mathrm{argMin}}[\overline{M}_j - \overline{f}(\theta, \overline{P}_j, \overline{O}_j)]^2 \tag{1}$$

wherein $\overline{P}_j$ is the location vector at pose j (e.g., pose $122_j$ in FIG. 1), $\overline{O}_j$ is the orientation vector at one of pose j, $\overline{M}_j$ is the measurement matrix of the magnetic field at pose j, $\overline{f}(\theta, \overline{P}_j, \overline{O}_j)$ is the magnetic field model and $\theta$ is a set parameters characterizing the model. $\overline{f}(\theta, \overline{P}_j, \overline{O}_j)$ determines the dependency between the magnetic field measurements, the parameters (i.e., $\theta$) of the magnetic field model and the dependency between the magnetic field measurements and the poses of the magnetic field detector. The parameters $\theta$ of $\overline{f}(\theta, \overline{P}_j, \overline{O}_j)$ may describe for example, a set of dipoles or coefficients of a polynomial function. Explicit expressions for $\overline{f}(\theta, \overline{P}_j, \overline{O}_j)$ are derivatives of Maxwell's equations. With reference to FIG. 1, processor 108 estimates the pose of mapping handle 106.

In procedure 422, the parameters characterizing the magnetic field model are re-estimated according to the estimated poses. The parameters of the magnetic field model are estimated according to the deviations between the measurements of the magnetic field flux and predictions of the magnetic field flux, at the estimated poses, for example, by minimizing the sum of squared differences there between. This is stated mathematically as follows:

$$\underset{\theta}{\mathrm{argMin}} \sum_{j=1}^{N} [\overline{M}_j - \overline{f}(\theta, \overline{P}_j, \overline{O}_j)]^2 \tag{2}$$

wherein N is the total number of locations. With reference to FIG. 1, processor 108 re-estimates the parameters of the magnetic field model according to the estimated poses.

In procedure 424, a 'model compatibility indicator' is determined. This model compatibility indicator represents the deviations between the magnetic field model and the actual magnetic field in the volume of interest. When the model compatibility indicator is larger then a determined value, designated as 'MCI' in FIG. 7, then, the method returns to procedure 420. When the model compatibility indicator is smaller or equal to the determined value, then, the estimated parameters stored. One exemplary model compatibility indicator is a cost function such as a Figure of Merit (FOM). This FOM represents, for example, the ratio between the difference between the measurements of the magnetic field flux and the prediction of the magnetic field flux according to the model, and the measurements of the magnetic field flux. This exemplary FOM is stated mathematically as follows:

$$FOM = \sqrt{\frac{\sum_{j=1}^{J}\sum_{i=1}^{k}[M_{ji} - f_i(\theta, \overline{P}_j, \overline{O}_j)]^2}{\sum_{i=1}^{k} M_{ji}^2}} \quad (3)$$

wherein k is the number of generator sensor pairs (e.g., in the case of three generators and three sensors there are nine generator sensor pairs), J is the number of measurements, $M_{ji}$ is the measurement, at pose j, of the magnetic field generated by one of the generator and sensed by one of the sensors. Furthermore, $f_i(\theta, \overline{P}_j, \overline{O}_j)$ is the magnetic field at pose j of the $i^{th}$ generator sensor pair, according to the magnetic field model. Another exemplary model compatibility indicator is the reciprocal of the number of repetition of the method (i.e., how many times the parameters characterizing the magnetic field model have been re-estimated). Yet another exemplary model compatibility indicator is the deviations between the poses of the magnetic field detector, determined according to the magnetic field model, and the poses of the magnetic field detector determined according to the images acquired by the imager. With reference to FIG. 1, processor 108 determines a model compatibility indicator of the magnetic field model for all poses of magnetic field receiver 104.

Still referring to FIG. 7, it is noted that determining the parameters of the magnetic field model and estimating the pose of the magnetic field detector may be performed simultaneously by, solving a set of equations which includes all the desired unknowns (i.e., pose parameters and model parameters). It is further noted that if the estimation of the parameters of the magnetic field does not converge, then, a different magnetic model having different parameters and coefficients may be determined and used.

The systems of FIGS. 1, 2, 3, and 4 are described hereinabove with a configuration wherein the magnetic field transmitter is fixed at a known pose in the volume of interest and the magnetic field detector is mounted on the tracked object. However, it is noted that the systems of FIGS. 1, 2, 3 and 4 may employ the configuration wherein the magnetic field transmitter is mounted on the mapping handle and the magnetic field detector is fixed at a known pose in the volume of interest. Furthermore, prior knowledge of the volume of interest may provide additional information regarding the possible orientations of the magnetic field detector. For example, there may be locations in a cockpit wherein the magnetic field detector can move only at unique orientations. The knowledge of these orientations provides further constraints to the estimated orientations at those locations. As another example, accelerometers may be coupled with the freestanding mapping handle. These accelerometers provide information regarding the direction and the distance the magnetic field detector traversed between two consecutive measurements. The estimated poses, of the magnetic field detector, at these two consecutive measurements must be consistent with the direction and distance determined according to the measurements from the accelerometers.

As mentioned hereinabove, a mapping system according to the disclosed technique may employ an imager for registering the reference coordinate system with the magnetic coordinate system. Further as described above, the system may employ accelerometers to provide constraints on the determined pose of magnetic field detector. Also as described above, the optical pose measurements, determined during registration with the reference coordinate, system may be used in conjunction with the magnetic field measurements for mapping the magnetic field (e.g., as constraints on the pose of the magnetic field detector).

Generally, a system according to another embodiment of the disclosed technique, includes at least one additional tracking system, which provides the additional information relating to the pose of the freestanding mapping handle and thus of the magnetic field detector. This additional tracking system or systems are, for example, an optical tracker (e.g., imagers with LEDs), Light Detection and Ranging—LIDAR system, motion capture module (e.g., such as Microsoft's® Kinect®), an inertial tracker, an ultrasound tracker, mechanical tracker or any combination thereof. The additional information may be employed as constraints when estimating the parameters characterizing the magnetic field model. For example, the additional tracking system may provide information relating only to selected pose parameters. These selected pose parameters may be selected location coordinates (i.e., either x, y or z or any combination thereof), selected orientation angles (i.e., either azimuth, elevation or roll or any combination thereof) or a selected combination of location coordinates and orientation angles (e.g., x, elevation and azimuth; y, z and roll; x, y, azimuth and elevation and the like). The selected pose parameters may also relate to all the pose parameters (i.e., x, y, z, azimuth, elevation and roll, also referred to herein as 'full pose information'). Pose Information relating to only a portion or the pose parameters (i.e., not to all the pose parameters) is referred to herein as partial pose information (e.g., x, and azimuth; x, y, z; azimuth elevation and roll).

The additional tracking system determines information relating to the pose of the freestanding mapping handle, and thus of the magnetic field detector, for at least a portion of the magnetic field flux measurements. Thus, at least a portion of the magnetic field flux measurements are associated with respective pose related information. The pose related information, respective of the portion of magnetic field flux measurement may include information relating to only the selected pose parameters (i.e., selected location coordinates or selected orientation angles or a selected combination of location coordinates and orientation angles). Additionally or alternatively, the pose related information respective of the portion of magnetic field flux measurement may include information relating to a set of locations or a set of orientations or a set of combinations of location and orientation. For example, a set of locations is a line (i.e., in the coordinate system associated with the additional tracking system) on which the magnetic field flux measurement is located. Furthermore, the pose related information respective of each of the portion of magnetic field flux measurement may include different pose parameters. For example, one measurement is associated only with location, another measurement is associated only with orientation, yet another measurement is associated with a line on which the measurement was acquired and yet another measurement is associated with location and orientation.

In general, the total number of acquired measurements should at least equal the number of unknown parameters of the magnetic field model. As mentioned above, the information relating to the pose respective of at least the portion of magnetic field flux measurements is employed as constraints or a range of constraints (e.g., due to the error of the additional tracking system) when estimating the parameters characterizing the magnetic field model. The system estimates the magnetic field model by iteratively solving a determined or over-determined set of equations, according to the magnetic field flux measurements and the poses related information respective of the portion of magnetic field flux measurements. It is noted that the magnetic field flux measurements, with no respective pose related information are also employed when estimating the magnetic field model. For example, the poses of these measurements may also be unknowns to be solved, when a sufficient number of measurements with respective pose related information are acquired. Also, pose parameters, which are not included in pose related information respective of the portion of magnetic field flux measurements, may also be unknowns to be solved. It is noted that when employing an additional tracking system to determine pose related information of a portion of magnetic field flux measurements, there is no need for the number of magnetic field generator times the number of magnetic field sensors to be larger than the number of degrees of freedom required to track the object. Additionally, the system does not require any prior knowledge regarding the magnetic field model (i.e., not even the generic dipole mentioned above in conjunction with FIG. 1 and FIG. 4). Rather, only the template of the model (e.g., the type of the mathematical function employed for modeling the magnetic field) is known as further explained below.

Accordingly, a system for mapping a magnetic field in a volume of interest according to another embodiment of the disclosed technique includes a magnetic field transmitter which generates a magnetic field in a volume of interest and at least one freestanding magnetic field detector, operative to freely move within said volume of interest. The at least one freestanding magnetic field detector acquires measurements of the flux of said magnetic field at a plurality of poses. The system further includes at least one Pose Information Acquisition Module (PIAM) for measuring information related to the pose of said freestanding magnetic field detector. This PAIM includes for example light emitters and an imager acquiring images of these light emitters, inertial sensors, ultrasound sensors receiving ultrasound signals from ultrasound transmitters, a mechanical tracking module (e.g., mechanical arm), Light Detection and Ranging (LIDAR) module (i.e., a laser and an imager), motion capture module (e.g., Kinect®) and the like. The magnetic field mapping system further includes a processor, coupled with the free standing magnetic field detector and with the at least one PIAM. The processor determines pose related information respective of at least a portion of the measurements according to the information related to the pose of the freestanding magnetic field detector, measured by the at least one PIAM (i.e., the processor and a PIAM define an additional tracking system). The processor estimates the entire set of parameters of a magnetic field model template according to the magnetic field flux measurement and the respective poses thereof and incorporates this entire set of parameters into the magnetic field model template, thereby determining the magnetic field model. The pose information acquisition model and the processor defining a tracking system. The model includes the coefficients of the magnetic field model, the order of the magnetic field model, the number of the centers of expansion and the location of the centers of expansion of the magnetic field model.

Figure 8:
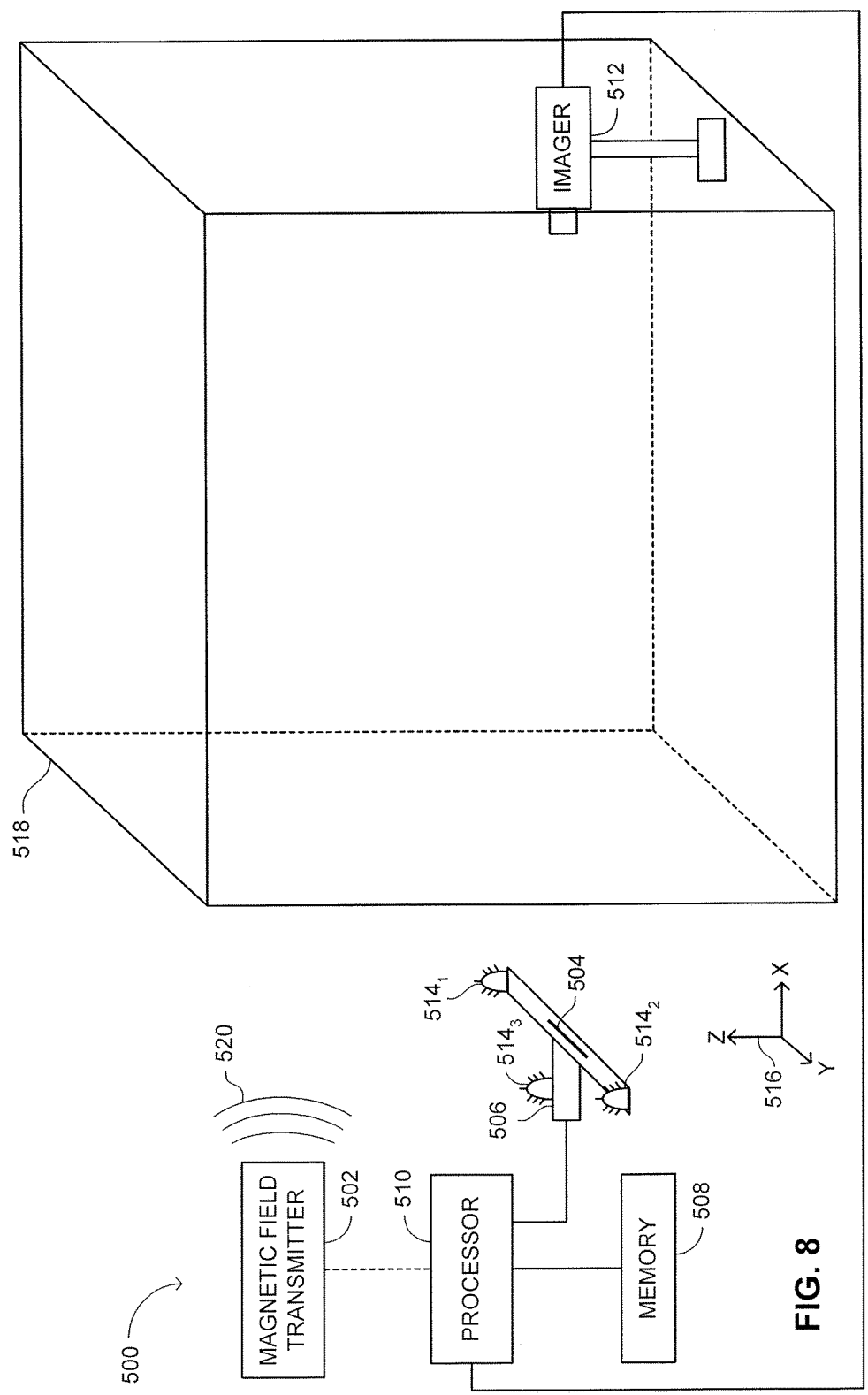
FIG. 8 is a schematic illustration of a system for mapping a magnetic field in a volume of interest, constructed and operative in accordance with another embodiment of the disclosed technique.

According to the disclosed technique, a single sensor and a single additional tracking system, which tracks the pose (i.e., the location and orientation) of the sensor in the volume of interest, is sufficient for mapping a magnetic field. Reference is now made to FIG. 8, which is a schematic illustration of a system, generally referenced 500, for mapping a magnetic field in a volume of interest, constructed and operative in accordance with another embodiment of the disclosed technique. System 500 includes a magnetic field transmitter 502, a magnetic field detector 504 a freestanding mapping handle 506, a memory 508 and a processor 510. System 500 further includes a PAIM, which includes an imager 512, and at least one light emitter. The PAIM depicted in FIG. 8 includes three light emitters $514_1$, $514_2$ and $514_3$. In general, an optical PIAM which includes a single emitter and a single imager is sufficient to acquire pose related information relating to the pose of magnetic field detector 504 as further explained below.

Magnetic field transmitter 502 includes one or more (e.g., three or six) magnetic field generators (e.g., coils with electric current flowing there through—not shown). Each magnetic field generator generates a magnetic field which is uniquely identifiable (e.g., each magnetic field has a unique frequency or each magnetic field is generated at a different time). Magnetic field detector 504 includes at least one magnetic field sensor (e.g., a coil with electric current induced therein or a hall-effect sensor). It is noted that in system 500, a single magnetic field sensor is sufficient for mapping the magnetic field. Light emitters $514_1$, $514_2$ and $514_3$ are light source (e.g., LED) or a light reflector (e.g., ball reflector) which reflects light incident thereon (i.e., either ambient light, light from various light sources located at the vicinity of the light reflector or from a dedicated light source directing light toward the light reflector). Imager 512 may be a camera operating in a respective spectrum (e.g., in the IR spectrum or in the visual spectrum or any other desired spectrum).

Processor 510 is coupled with magnetic field detector 504, with memory 508 with imager 512, with light emitters 518 and with light emitters $514_1$, $514_2$ and $514_3$. Processor 510 is optionally further coupled with magnetic field transmitter 502 (i.e., magnetic field transmitter 502 may operate independently of processor 510). Imager 512, light emitters $514_1$, $514_2$ and $514_3$ and processor 510 define an optical tracking system. The optical tracking system is associated with an optical coordinate system 516.

Magnetic field detector 504 and light emitters $514_1$, $514_2$ and $514_3$ are all firmly coupled with freestanding mapping handle 506. Thus, magnetic field detector 504 and light emitters $514_1$, $514_2$ and $514_3$ are also freestanding. Furthermore, the spatial relationship (i.e., the relative poses) between light emitters $514_1$, $514_2$ and $514_3$ is known. Also, imager 512 is located at a respective fixed position in reference coordinate system 516. It is noted that imager 512 need not be within volume of interest 518. However, volume of interest 518 should be within the Field Of View (FOV) of imager 512. Unlike the magnetic field mapping systems described hereinabove in conjunction with FIGS. 1-7, for the purpose of mapping a magnetic field, in system 500, the total number of magnetic field sensors in magnetic field detector 504, times the number of magnetic field generators in magnetic field transmitter 502, need not be larger than the number of degrees of freedom required for tracking the object.

Magnetic field transmitter 502 generates a magnetic field 520 toward a volume of interest 518. An operator (not shown) holds freestanding mapping handle 506 in her hand and freely moves freestanding mapping handle 506. Thus, the operator also freely moves first magnetic field detector 504 and light emitters $514_1$, $514_2$ and $514_3$ within volume of interest 518. Magnetic field detector 504 measure the magnetic flux at a plurality of poses (i.e., a plurality of locations or orientations or both). Processor 510 determines the magnetic field vector corresponding to each pose according to the measurements of the magnetic field flux.

Simultaneously to the acquisition of the magnetic field flux measurement, the optical tracking system (i.e., processor 510) determines pose related information respective freestanding mapping handle 508 and thus respective magnetic field detector 508. Thus, the optical tracking system determines pose related information (i.e., in optical coordinate system 516) respective of at least a portion of the magnetic field flux measurements (e.g., since one or more of light emitters $514_1$, $514_2$ and $514_3$ was obscured from imager 512). As mentioned above, the pose related information may include information relating to only selected pose parameters. Additionally or alternatively, the pose information relating to the portion of magnetic field flux measurements may include information relating to a set of location or a set of orientation or a set of combinations of location and orientation of magnetic field detector 508. Also, the pose related information of each of the portion of magnetic field flux measurement may include different pose parameters.

Processor 510 estimates the magnetic field model at least according to the magnetic field flux measurements and the poses related information respective of the portion of magnetic field flux measurements. Processor 510 employs the pose related information of the magnetic field flux measurement as constraints or a range of constraints (e.g., due to the error of the optical tracking system). Processor 510 estimates the magnetic field model by iteratively solving a determined or over-determined set of equations, according to the magnetic field flux measurements and the poses related information respective of the portion of magnetic field flux measurements. Processor 510 may also employ the magnetic field flux measurements with no respective pose related information when estimating the magnetic field model. For example, pose of these measurements may also be unknowns to be solved, when a sufficient number of measurements with respective pose related information are acquired. Also, pose parameters, which are not included in pose related information respective of the portion of magnetic field flux measurements, may also be unknowns to be solved. Consequently, processor 510 estimates the magnetic field model is estimated in optical coordinate system 524. Also, processor 510 does not need any prior knowledge of the magnetic field model. Processor 510 only needs prior knowledge relating to the template of the model, for example, harmonic functions (e.g., spherical harmonics, elliptical harmonics, cylindrical harmonics, Fourier series) and the like. Processor 510 estimates not only the coefficients of the model but also the degree of the model, the location of the center of expansion of the model in the optical coordinate system 510 and the number of centers of expansion. The location of the center of expansion of the model relates to the location of the magnetic field generator or generators and to passive magnetic field sources such as metallic objects in which eddy currents are induced. Furthermore, processor 510 does not need to determine the absolute pose of each measurement of the magnetic flux. Rather it is sufficient for processor 510 to determine the relative pose between the current and the previous measurements of the magnetic flux. It is also noted that for determining the order of the model, and the number and locations of the center of expansions, the poser related information respective of at least one of the magnetic field flux measurements should include all the location pose parameters (i.e., x, y and z).

Magnetic field mapping system 500 described herein above in conjunction with FIG. 8 employs an optical tracking system to provide the pose related information respective of the portion of magnetic field flux measurements. However, other kinds of tracking systems, which provide the reference poses in a coordinate system associated therewith, with sufficient degree of accuracy, may be employed. For example, the optical tracking system described in conjunction with FIG. 8 may be replaced with either an inertial tracking system, an ultrasound tracking system or a mechanical tracking system, which provides the respective reference locations and orientation associated with the magnetic field flux measurements. Furthermore, a combination of tracking systems may be employed for increasing accuracy of the magnetic field mapping system and providing redundancy and additional functionality thereto as further explained below. In addition, the optical tracking system described hereinabove in conjunction with FIG. 8 exhibits and an out-in configuration (i.e., the imager is stationary and the light emitters are mobile). However, an optical tracking system exhibiting an in-out configuration (i.e., the imager is mobile and the light emitters are stationary) or an in-out-out-in configuration (i.e., a mobile imager and mobile light emitters and a stationary imager and stationary light emitters) may also be employed.

As mentioned above in conjunction with FIG. 8, an optical tracking system determines the pose of magnetic field handle 506. To that end, imager 512 acquires an image or images of light emitters $514_1$, $514_2$ and $514_3$. The acquired images include information relating to light emitters $514_1$, $514_2$ and $514_3$. The information relating to light emitters $514_1$, $514_2$ and $514_3$ is referred to herein as "representations" of the light emitters. These representations may be the sampled image or images or information relating to objects in the image associated light emitters $514_1$, $514_2$ and $514_3$. Processor 510 determines the pose of freestanding mapping handle 506 relative to optical coordinate system 516 according to the representations of light emitters $514_1$, $514_2$ and $514_3$ provided thereto by imager 512.

In general to determine the location and orientation of freestanding mapping handle 506, processor 512 generates and solves at least six equations with six unknowns (e.g., three unknowns for location, the x, y and z coordinates and three unknowns for orientation, the azimuth elevation and roll angles). A representation of a light emitter is associated with two angles. For example, when the optical sensor of imager 512 is a CCD sensor, the CCD sensor is associated with a physical center. An imaginary line passing through this physical center, perpendicular to the sensor plane, defines the optical axis of the CCD sensor. Each pixel in the CCD sensor is associated with a respective location on the CCD sensor, defined by a sensor 2D coordinates system in pixel units (e.g., a pixel located at coordinates [2;3] in the sensor 2D coordinates system is the pixel at the intersection of the second colon of pixels with the third row of pixels). Accordingly, each pixel is associated with a horizontal angle and a vertical angle from the optical axis of the sensor, related to the location of the pixel in the sensor 2D coordinate system. Consequently, each representation of a light emitter determined from an image acquired by a CCD sensor is also associated with a respective horizontal angle and a vertical angle from the optical axis of the CCD sensor. Thus, the representation associated with each of light emitters $514_1$, $514_2$ and $514_3$, determined from the image acquired by imager 512, is associated with two respective angles. Accordingly a total of six measurements of angles are acquired. These angles, along with the known spatial relationship (i.e., relative location) between light emitters $514_1$, $514_2$ and $514_3$, define the above mentioned six equations with six unknowns. Processor 512 solves these equations to determine the location and orientation of freestanding mapping handle 506 and thus of magnetic field detector 504. Nevertheless, when, for example, a single light emitter is employed or detected by the imager, the two angles associated with the representation of this single light emitter define a line in the reference coordinate system (e.g., optical coordinate system 516. As mentioned above, such a line may be employed as pose related information respective of a magnetic field flux measurement. When two light emitters are employed or detected by the imager, the two angles associated with each representation the two light emitters and the known spatial relationship between these two light emitters provide sufficient information to determine four pose parameters in the reference coordinate system. These four pose parameters may be employed as pose related information respective of a magnetic field flux measurement.

Figure 9:
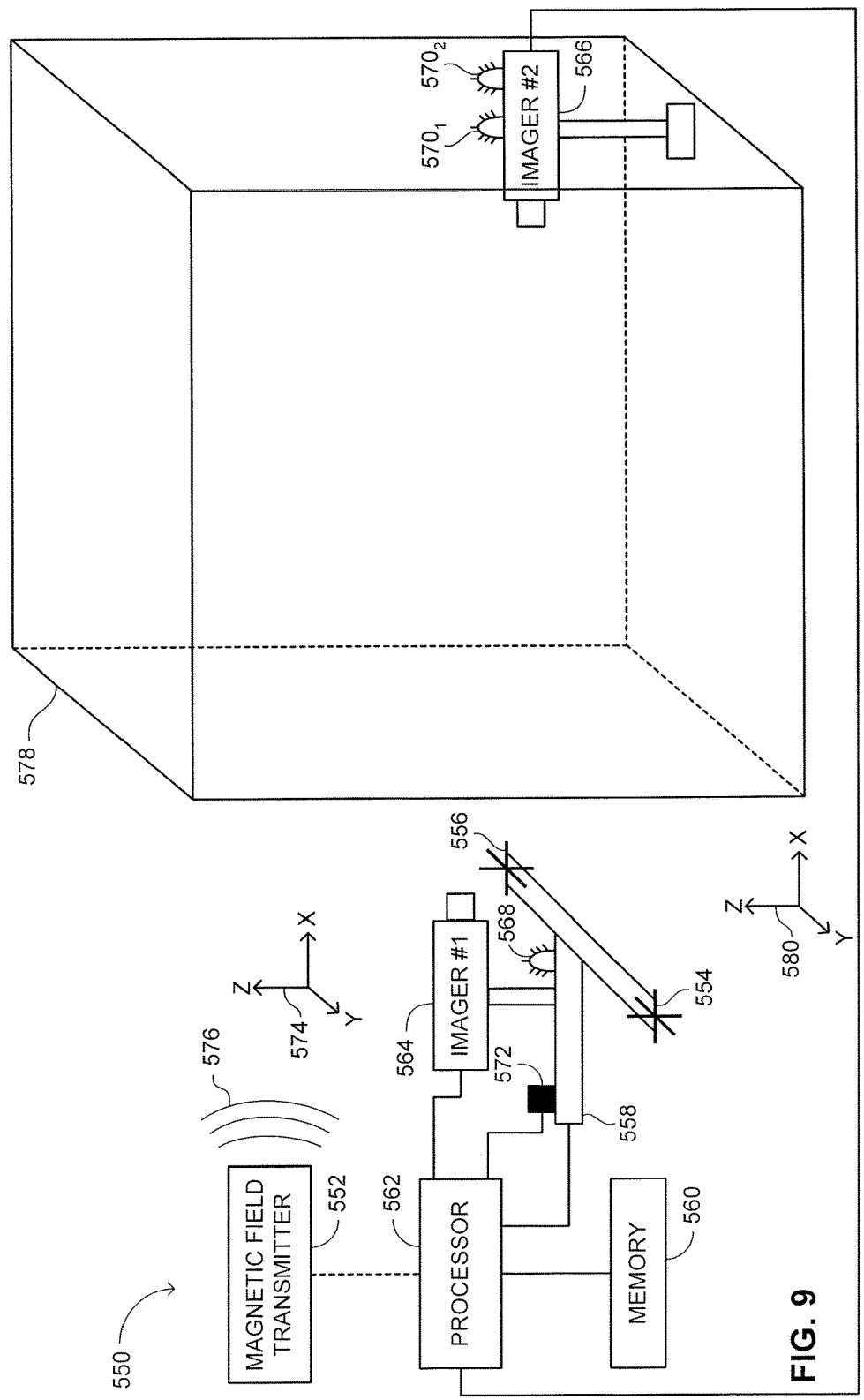
FIG. 9 is a schematic illustration of a system for mapping a magnetic field in a volume of interest, constructed and operative in accordance with a further embodiment of the disclosed technique.

Reference is now made to FIG. 9, which is a schematic illustration of a system, generally referenced 550, for mapping a magnetic field in a volume of interest, constructed and operative in accordance with a further embodiment of the disclosed technique. System 550 includes a magnetic field transmitter 552, a first magnetic field detector 554, a second magnetic field detector 556, a freestanding mapping handle 558, a memory 560 and a processor 562. System 550 further includes a first PIAM which includes a first imager 564, a second imager 566, at least one moving light emitter 568, at least two fixed light emitters $570_1$ and $570_2$. System 550 also includes a second PAIM, which includes inertial tracking sensors 572 (e.g., gyro sensors). System 550 may further include a guide (not shown) similar to the guide 160 described hereinabove conjunction with FIG. 2.

Magnetic field transmitter 552 includes one or more (e.g., three) magnetic field generators. Each magnetic field generator generates a magnetic field which is uniquely identifiable (e.g., each magnetic field has a unique frequency or each magnetic field is generated at a different time). Each one of first magnetic field detector 554 and second magnetic field detector 556 include one or more (e.g., three) magnetic field sensors. Either one of at least one moving light emitter 568 and at least two fixed light emitters $570_1$ and $570_2$ are a light source or a light reflector similar to light emitters $514_1$, $514_2$ and $514_3$ of FIG. 8. Each one of imager 566 and imager 564 may be a camera operating in a respective spectrum (i.e., similar to imager 512 of FIG. 8).

Processor 562 is coupled with first magnetic field detector 554 and with second magnetic field detector 556, with memory 560, with first imager 564, with moving light emitter 568, with second imager 566, with each of fixed light emitters $570_1$ and $570_2$ and with inertial navigation sensors 572. Processor 562 is optionally further coupled with magnetic field transmitter 552 (i.e., magnetic field transmitter 552 may operate independently of processor 562). First imager 564, second imager 566, moving light emitter 568, reference light emitters $570_1$ and $570_2$ and processor 562 define an optical tracking system. Inertial tracking sensors 572 and processor 562 define an inertial tracking system. The optical tracking system is associated with an optical coordinate system 574. Volume of interest 578 is associated with a reference coordinate system 580.

First magnetic field detector 554, second magnetic field detector 556, first imager 564 and moving light emitter 568 are all firmly coupled with freestanding mapping handle 558. Thus, first magnetic field detector 554, second magnetic field detector 556, first imager 564 and moving light emitter 568 are also freestanding. Furthermore, the spatial relationship (i.e., the relative pose) first imager 564 and moving light emitter 568 is known. Also, second imager 566 and fixed light emitters $570_1$ and $570_2$ are located at a respective fixed position in reference coordinate system 580 and the spatial relationship therebetween is known. In FIG. 9, fixed light emitters $570_1$ and $570_2$ are depicted as fixedly coupled with second imager 566. It is noted that second imager 566 need not be within volume of interest 578. However, volume of interest 578 should be within the FOV of second imager 566. Furthermore, fixed light emitters $570_1$ and $570_2$ should be within the FOV of first imager 564. Unlike the systems described herein above in conjunction with FIGS. 1-7, and similar to system 500, for the purpose of mapping a magnetic field, the total number of magnetic field sensors in first magnetic field detector 554 and second magnetic field detector 556, times the number of magnetic field generators in magnetic field transmitter 558, need not be larger than the number of degrees of freedom required for tracking the object.

Magnetic field transmitter 552 generates a magnetic field 576 toward a volume of interest 578. An operator (not shown) holds freestanding mapping handle 558 in her hand. The operator freely moves freestanding mapping handle 558. Thus, the operator also freely moves first magnetic field detector 554, second magnetic field detector 556, first imager 564, moving light emitter 568 and inertial tracking sensors 572 within volume of interest 578. First magnetic field detector 554 and second magnetic field detector 556 measure the magnetic flux at a plurality of poses (i.e., a plurality of locations or orientations or both). Processor 564 determines the magnetic field vector corresponding to each pose according to the measurements of the magnetic field flux.

Simultaneously to the acquisition of the magnetic field flux measurement, the optical tracking system (i.e., processor 564) determines pose related information respective of freestanding mapping handle 558 in optical coordinate system 580 for at least a first portion of the magnetic field flux measurements. The inertial tracking system also determines pose related information respective of freestanding mapping handle 558 in an inertial coordinate system (not shown), for at least a second portion of the magnetic field flux measurements. It is noted that the first portion of magnetic field flux measurements and the second portion of magnetic field flux measurements may be mutually exclusive, partially overlap or completely overlap (i.e., the two portions are one and the same). When the inertial coordinate system is registered with optical coordinate system 580, the pose related information, measured by the two tracking systems, and associated with the same magnetic field flux measurement, may be fused to provide a single pose related information measurement. The measurement of the two systems may be fused, for example, according to a linear combination of the two measurements weighted by their respective noise variances or by applying a Kalman filter as is known in the art. Consequently, processor 562 also determines the pose (i.e., the location and orientation) of first magnetic field detector 554 and of second magnetic field detector 556 in optical coordinate system 574.

Similar to as described above, processor 562 estimates the magnetic field model by iteratively solving a determined or over-determined set of equations according to the magnetic field flux measurements and the pose related information respective of the selected first and second portions of magnetic field flux measurements. The magnetic field flux measurements with no respective pose related information are also employed when estimating the magnetic field model similar to as described above. Also, pose parameters, which are not included in pose related information respective of the portion of magnetic field flux measurements, may also be unknowns to be solved. Consequently, the magnetic field model is estimated in optical coordinate system 574.

As mentioned above, processor 562 does not need any prior knowledge of the magnetic field model. Processor 562 needs prior knowledge relating only to the template of the model, for example, harmonic functions such as spherical harmonics, cylindrical harmonics or elliptical harmonics Fourier series and the like. Processor 562 estimates not only the coefficients of the model but also the degree of the model (e.g., the degree of the polynomial, or the degree and the order of the spherical harmonics), the location of the center of expansion of the model in the optical coordinate system 574 and the number of centers of expansion. The location of the center of expansion of the model relates to the location of the magnetic field generator or generators as well as to and to passive magnetic field sources (e.g., metallic objects with eddy currents induced therein). Furthermore, processor 562 does not need to determine the absolute pose of each measurement of the magnetic flux in optical coordinate system 574. Rather, it is sufficient for processor 562 to determine the relative pose between the current and the previous measurements of the magnetic flux. In other words optical coordinate system 574 may be completely arbitrary. For example, the origin and orientation of optical coordinate system 574 may be determined according to the pose of the first measurement. It is also noted that for determining the order of the model, and the number and locations of the center of expansions, the poser related information respective of at least one of the magnetic field flux measurements should include all the location pose parameters (i.e., x, y and z).

The optical tracking system in FIG. 9 exhibits an in-out-out-in configuration. Thus, the representation of moving light emitter 568, determined from the image acquired by second imager 566, is associated with two respective angles. Furthermore, each representation of each fixed light emitters 570$_1$ and 570$_2$, determined from the image acquired by first imager 564, is also associated with two respective angles. Accordingly a total of six measurements of angles are acquired. These angles, along with the known spatial relationship (i.e., relative pose) between fixed light emitters 570$_1$ and 570$_2$ and second imager 566, and the known spatial relationship between moving light emitter 568 and first imager 564, define the above mentioned six equations with six unknowns. Processor, 562 solves these equations to determine the location and orientation of freestanding mapping handle 558.

As mentioned above, a system according to the disclosed technique does not require any prior knowledge regarding the magnetic field model but rather, only the template of the model is known. For example, the model is of the following template:

$$\varphi(r, \theta, \phi) = \sum_{s=1}^{S} \sum_{l=0}^{L} \sum_{m=-l}^{l} c_{l,m,s} \frac{Y_{l,m,s}(\theta, \phi)}{r^{l+1}} + b_{l,m,s} \cdot r^{l} \cdot Y_{s,l,m}(\theta, \phi) \quad (4)$$

wherein $\varphi(r,\theta,\phi)$ is the magnetic potential at a point defined by the spherical coordinates r,θ,φ, S defines the number of expansion centers, L defines the degree of the model, m defines the order of the model, $c_{l,m}$ and $b_{l,m}$ are coefficients to be estimated and $Y_{s,l,m}(\theta,\phi)$ is a set of spherical harmonic functions of degree l and order m and expanded about expansion center s, which are known in the art (i.e., the location of the expansion center is included within $Y_{s,l,m}(\theta, \phi)$). The system according to the disclosed technique described hereinabove in conjunction with FIG. 8 and FIG. 9 (e.g., processor 510 in FIG. 8 and processor 612 in FIG. 9) estimates the entire set of model parameters of the magnetic field model template of equation (4), L and m inclusive, as well as the number of expansion centers S and their respective locations. The magnetic field is described by the gradient of $\varphi(r,\theta,\phi)$:

$$\vec{B} = -\nabla\varphi(r,\theta,\phi) \quad (5)$$

Thus, even if no prior knowledge regarding the magnetic field in the volume of interest exist, the system according to the disclosed technique may still determine a model of the magnetic field within that volume of interest.

According to another example, the magnetic field model exhibits the following template:

$$f(\xi) = M(\xi) \cdot \Theta_M = \sum_{s=1}^{S} \sum_{l=0}^{L} [M_l(-r^{(s)} + r^0) \cdot \Theta_l^{(Ts)}] \quad (6)$$

where ξ represents the position of the sensor, L defines the degree of the model, S defines the number of expansion centers, M(ξ) represents the spherical harmonics mode matrices and $\Theta_M$ represents the coefficients matrices respective of each matrix M. Accordingly, $M_l(-r^{(s)}+r^0)$ is spherical harmonics mode matrices and $\Theta_l^{(Ts)}$ is the respective coefficient matrix where $r^{(s)}$ represents the distance of the expansion center of the matrix from the origin (e.g., of optical coordinate system 516) and $r^0$ represents the distance of the magnetic field detector from the origin. Similar to as described above, the system according to the disclosed technique described estimates not only $\Theta_M$ but also M (i.e., size and entries), L and the number of expansion centers S and their respective locations.

A system according to the disclosed technique employs, for example, the least squares method for estimating the entire set of parameters of the magnetic field model. A magnetic field model which fits, for example, one of the above templates described in equation (5) and (6), is estimated according to the deviations between the measurements of the magnetic field flux and predictions of the magnetic field flux, at the respective reference poses of each measurement (i.e., as determined by the optical tracking system). For example, the magnetic field model is estimated by minimizing the sum of squared differences between the measurements of the magnetic field flux and predictions of the magnetic field flux, at the respective reference poses of each measurement (i.e., minimizing the $L^2$-norm of the error). Alternatively, the $L^1$-norm or the $L^\infty$-norm may be minimized.

To determine the order of the model the number of expansion centers and locations of the expansion center, the system according to the disclosed technique, iteratively increases the number of expansion centers and the order of the model and determines if the estimated model converges. (e.g., according to a FOM described above in equation (3)).

For example, starting with a first order model and single center of expansion, the system estimates the parameters of the magnetic field model including the location of the center of expansion. If the FOM described hereinabove in conjunction with equation (3) increases, then the system determines that the estimated model does not converge (i.e., diverge). If the estimated model does not converge, the system increases the order of the model and attempts to estimate the parameters of the model again. The system continues to increase the order of the model until a FOM reaches a determined threshold or until the estimated model begins to diverge relative to previous estimated orders (i.e., due to the system noise). If the estimated model begins to diverge and the FOM has yet to reach the determined threshold, an additional expansion center is added to the model and the process repeats.

When estimating a magnetic field model according to the disclosed technique, as described above in conjunction with FIGS. 1-9, the volume of interest is generally larger than the volume in which the object being tracked is expected to move. In other words, the volume of interest is larger than the expected motion box of the object being tracked. For example, the volume of interest is the cockpit of an aircraft and the object being tracked is the helmet of the pilot. Thus, the motion box is only the region with in the cockpit in which the helmet of the pilot is expected to move. Since the accuracy of the estimated model deteriorates at the boundaries of the model, estimating the magnetic field within a volume of interest which is larger than the expected motion box of the object being tracked, increases the accuracy of the a magnetic tracking system which employs the estimated magnetic field model, at the boundaries of the motion box. Alternatively, estimating the magnetic field within a volume of interest which is larger than the expected motion box of the object being tracked enables tracking a magnetic field detector event when that detector is located outside the expected motion box.

Figure 10A:
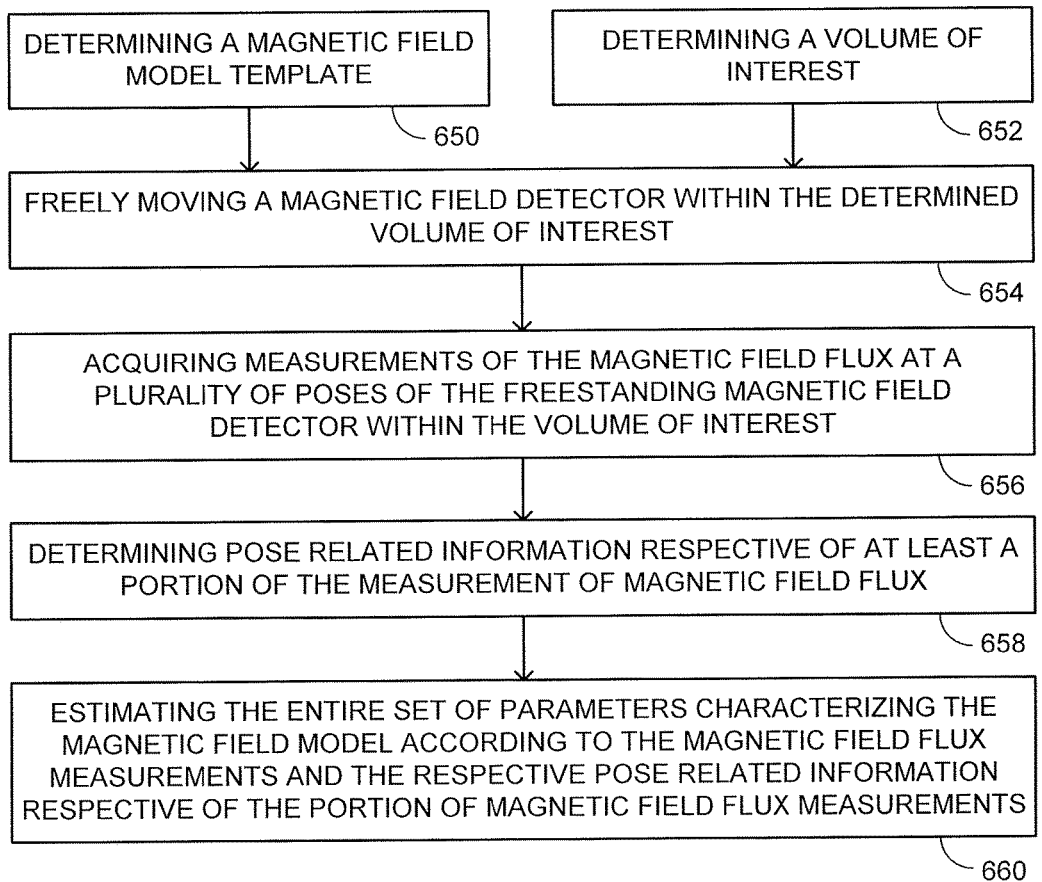
FIGS. 10A and 10B are schematic illustrations of a method for estimating an entire set of parameter of a magnetic field model in accordance with a further embodiment of the disclosed technique.
Figure 10B:
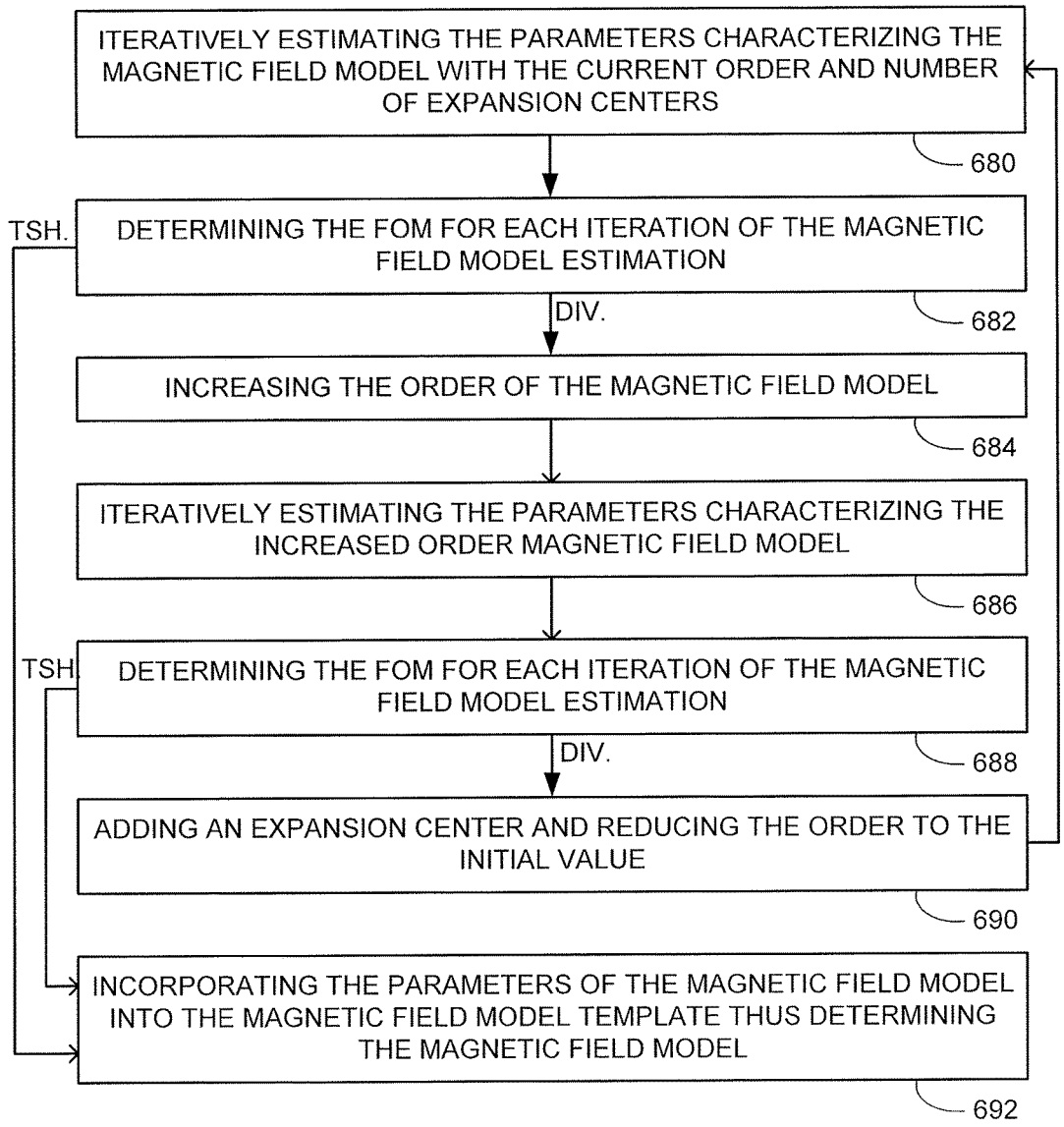

Reference is now made to FIGS. 10A and 10B which are schematic illustrations of methods for estimating an entire set of parameter of a magnetic field model in accordance with a further embodiment of the disclosed technique. In procedure 650, a magnetic field model template is determined. This magnetic field model template is, for example, the magnetic field model template described herein above in equation (4) or in equation (6).

In procedure 652, a volume of interest is determined. When estimating a magnetic field model according to the disclosed technique, the volume of interest is larger than the expected motion box of the object being tracked. Thus, the motion box is only a region with in the volume of interest in which the object being tracked is expected to move. Since the accuracy of the estimated model deteriorates at the boundaries of the model, estimating the magnetic field within a volume of interest, which is larger than the expected motion box of the object being tracked, increases the accuracy of the a magnetic tracking system which employs the estimated magnetic field model, at the boundaries of the motion box and allows tracking a magnetic field sensors that is located outside the motion box. With reference to FIGS. 8 and 9, volume of interest 518 (FIG. 8) and volume of interest 578 are determined as the volume of interest In procedure 654, a freely moving a magnetic field detector is moved within the determined volume of interest. The magnetic field detectors may be moved within the volume of interest at a random trajectory. Alternatively, the magnetic field detectors may be freely guided towards regions of interest within the volume of interest. With reference to FIGS. 8 and 9, a user freely moves freestanding mapping handle 506 (FIG. 8) and freestanding mapping handle 558 (FIG. 9), each of which include at least one magnetic field detector attached thereto (i.e., magnetic field detector 504 in FIG. 8 and magnetic field detector 554 and 556 in FIG. 9).

In procedures 656 measurements of the magnetic field flux are acquired at a plurality of locations and orientations of the freestanding magnetic field detector within the volume of interest. With Reference to FIG. 8, magnetic field detector 504 acquires measurements of the magnetic field flux at a plurality of locations and orientations thereof. With reference to FIG. 9, detector 554 and 556 in FIG. 9) acquire measurements of the magnetic field flux at a plurality of locations and orientations thereof.

In procedure 658, pose related information, respective at least a portion of the measurement of magnetic field flux, is determined. This pose related information is determined by an additional tracking system. The additional tracking system may be an optical tracking system, an inertial tracker, an ultrasound tracker, a mechanical tracking system or any combination thereof which provides the additional information relating to the pose of the freestanding mapping handle and thus of the magnetic field detector. This pose related information may be employed as constraints when estimating the parameters characterizing the magnetic field model. For example, the additional tracking system may provide information relating only to selected pose parameters. These selected pose parameters may be selected location coordinates (i.e., either x, y or z or any combination thereof), selected orientation angles (i.e., either azimuth, elevation or roll or any combination thereof) or a selected combination of location coordinates and orientation angles (e.g., x, azimuth and elevation; y, z and roll; x, y, azimuth and elevation and the like). The selected pose parameters may also relate to all the pose parameters (i.e., x, y, z, azimuth, elevation and roll).

The pose related information respective of the portion of magnetic field flux measurement may include information relating to only the selected pose parameters (i.e., selected location coordinates or selected orientation angles or a selected combination of location coordinates and orientation angles) at each of the selected magnetic field flux measurements. Additionally or alternatively, the information relating to the pose of the magnetic field flux measurement may include information relating to a set of locations or a set of orientations or a set of combinations of location and orientation. For example, a set of locations is a line (i.e., in the coordinate system associated with the additional tracking system) on which the magnetic field flux measurement is located. Furthermore, the pose related information of each of the portion of magnetic field flux measurement may include different pose parameters. For example, one measurement is associated only with location, another measurement is associated only with orientation, yet another measurement is associated with a line on which the measurement was acquired and yet another measurement is associated with location and orientation. With reference to FIG. 8, the optical tracking system, defined by imager 512, light emitters $514_1$, $514_2$, $514_3$ and processor 510 determines pose related information respective of a portion of the magnetic field flux measurements acquired by magnetic field detector 504. With reference to FIG. 9, first imager 564, second imager 566, light emitter 568, light emitters $570_1$, $570_2$, and processor 562 define an optical tracking system. Inertial sensor and processor 562 define an inertial tracking system. This combination of tracking systems determine pose related information respective of a portion of magnetic field flux measurements acquired by magnetic field detectors 554 and 556.

In procedure 660, the entire set of parameters characterizing the magnetic field model is estimated according to the magnetic field flux measurements and the pose related information respective of the portion of magnetic field flux measurements. This entire set includes the coefficients of the model as well as the order of the model, the number expansion centers of the model and the location of the expansion centers. Once the entire set of parameters is estimated these parameters are incorporated into the magnetic field model template thus defining the estimated magnetic field model. It is noted that the magnetic field flux measurements with no respective pose related information are also employed when estimating the magnetic field model. For example, pose of these measurements may also be unknowns to be solved, when a sufficient number of measurements with respective pose related information are acquired. Also, pose parameters, which are not included in pose related information respective of the portion of magnetic field flux measurements, may also be unknowns to be solved. It is also noted that for determining the order of the model, and the number and locations of the center of expansions, the poser related information respective of at least one of the magnetic field flux measurements should include all the location pose parameters (i.e., x, y and z). With reference to FIG. 8, processor 510 estimates the entire set of parameters characterizing the magnetic field model. With reference to FIG. 9, process 562 estimates the entire set of parameters characterizing eh magnetic field model. Estimating the entire set of parameters is further elaborated in conjunction with FIG. 10B.

With reference to FIG. 10B, in procedure 680, the parameters characterizing the magnetic field model, with the current order and the current number of expansion centers, are iteratively estimated. Initially, the current order and the current number of expansion centers exhibit selected initial values. The location or locations of the expansion center or centers are parameters to be estimated. The parameters of the magnetic field model are estimated, for example, by employing the least squares method. With reference to FIG. 8, processor 510 iteratively estimates the parameters characterizing the magnetic field model. Similarly, with reference to FIG. 9, processor 562 iteratively estimates the parameters characterizing the magnetic field model.

In procedure 682, a FOM is determined for each iteration of the magnetic field model estimation. This FOM is, for example, the FOM described hereinabove in equation (3). When the FOM decreases, the model is determined to converge. When the FOM increases, the model is determined to diverge. With reference to FIG. 8, processor 510 determines the FOM of the estimated magnetic field model. Similarly, with reference to FIG. 9, determines the FOM of the estimated magnetic field model. When the magnetic field model is determined to diverge, designated 'DIV.' in FIG. 10B then, the method proceeds to Procedure 684. When the FOM is determined to reach a determined threshold, designated 'TSH.' in FIG. 10B then, the method proceeds to Procedure 692.

In procedure 684, the order of the magnetic field model is increased. With reference to FIGS. 8 and 9 processor 510 and processor 562 respectively increase the order of the magnetic field model.

In procedure 686, the parameters characterizing the increased order magnetic field model are iteratively estimated. With reference to FIG. 8, processor 510 iteratively estimates the parameters characterizing the increased order magnetic field model. Similarly, with reference to FIG. 9, processor 562 iteratively estimates the increased order parameters characterizing the magnetic field model.

In procedure 688, a FOM is determined for each iteration of the magnetic field model estimation. When the FOM increases, the model is determined to diverge. With reference to FIG. 8, processor 510 determines the FOM of the estimated magnetic field model. Similarly, with reference to FIG. 9, determines the FOM of the estimated magnetic field model. When the new increased order magnetic field model is determined to diverge, designated 'DIV.' in FIG. 10B then, the method proceeds to Procedure 690. When the FOM is determined to reach a determined threshold, designated 'TSH.' in FIG. 10B then, the method proceeds to Procedure 692.

In procedure 690, an expansion center is added to the magnetic field mode and the order of the magnetic field model is reduce back to the initial value. With reference to FIGS. 8 and 9 processor 510 and processor 562 respectively add an expansion center is added to the magnetic field mode and reduce the order of the magnetic field model to the initial value. The method returns to Procedure 680.

In procedure 692, the parameters characterizing the magnetic field model are incorporated into the magnetic field model template, thus defining the magnetic field model. With reference to FIGS. 8 and 9 processor 510 and processor 562 respectively incorporated the parameters characterizing the magnetic field model into the magnetic field model template.

In general, the magnetic field mapping systems described hereinabove in conjunction with FIGS. 1-5, the magnetic field sensors or magnetic field detectors should be calibrated. In other words, parameters relating to the magnetic field sensors or magnetic field detectors should be known. For example, the parameters of a magnetic field sensor such as a coil may include the cross-sectional area of the coil, the number of turns, the length, the resistance, the capacitance, the inductance and the Q-factor of the coil. The parameters of a magnetic field detector including several coils may include the relative location and orientation between coils and the mutual inductance between the coils in addition to the parameters relating to each coil.

The magnetic field mapping systems described hereinabove in conjunction with FIGS. 8 and 9 may further be employed to calibrate the magnetic field sensors and detectors employed thereby. In general, the parameters relating to the magnetic field detectors and sensors included therein are introduced to the magnetic field model as parameters to be estimated. For example, when considering only the cross-sectional area A, the number of turns N and the resistance R of a coil, the magnetic field B, inducing a current I in the coil may be given by:

$$B = \int \frac{-IR}{NA} \cos\alpha \, dt \qquad (7)$$

where α is the angle between the coil axis and the magnetic field flux lines. Accordingly, in the mapping systems described above in conjunction with FIGS. 8 and 9, instead of evaluating B from given values of the parameters relating to the magnetic field sensors and detectors (e.g., A, N and R in equations (6)) and the measured current, the system estimates the parameters of both the magnetic field model and the parameters relating the magnetic field detectors and sensors yielding the resulting current measurements. In general the number of measurements should at least equal the number of unknowns (i.e., model parameters, sensor parameters and detector parameters).

The systems according to the disclosed technique described hereinabove in conjunction with FIGS. 8 and 9 do not necessarily estimate the parameters relating the magnetic field detectors and sensors during the mapping but rather only when needed. For example, when the magnetic field model estimation process does not converge to a solution (e.g., after a predetermined number of iterations), then, processor 510 (FIG. 8) and processor 562 (FIG. 9) may introduce one or more of the parameters relating the either the magnetic field detectors or the magnetic field sensors or both to the magnetic field model estimation process. As a further example, if during before or during the mapping process the mapping handle was inflicted with a mechanical shock (e.g., due to a fall or miss-handling by the user) then user may direct the system to include introduce one or more of the parameters relating the either the magnetic field detectors or the magnetic field sensors or both to the magnetic field model estimation process.

According to another embodiment of the disclosed technique, the object being tracked (e.g., the helmet), which includes a magnetic field detector and a pose information acquisition module (e.g. inertial tracking sensors, a camera or both) may be employed for mapping the magnetic field (i.e., there is no need for a mapping handle). Since the object is free to move within the volume of interest (i.e., the object is free standing), the magnetic field detector located thereon is also freestanding. Prior or even during the tracking of the object (e.g., either periodically or when the tracking accuracy deteriorates), the object being tracked freely moves within the volume of interest. Thus, the magnetic field detector also freely moves within the volume of interest. The magnetic field detector measures the magnetic flux at a plurality of poses and the system determines the magnetic field vector corresponding to each pose, according to the measurements of the magnetic field flux.

Simultaneously to the acquisition of each magnetic field flux measurement, a pose information acquisition module determines pose information related to the pose of the object being tracked and thus respective of the magnetic field detector. The system can thus, determined the pose related information respective of each of at least a portion of the magnetic field flux measurements. The system estimates the magnetic field model at least according to the magnetic field flux measurements and the poses related information respective of the magnetic field flux measurements as described above. The system does not need any prior knowledge of the magnetic field model nor any prior knowledge regarding the magnetic characteristics of the volume of interest (e.g., location of metal objects, strength of the earth magnetic field and the like) but rather only knowledge relating to a selected template of the model according to which the model would be estimated. The system estimates the entire set of parameters of the magnetic field model template.

It will be appreciated by persons skilled in the art that the disclosed technique is not limited to what has been particularly shown and described hereinabove. Rather the scope of the disclosed technique is defined only by the claims, which follow.

The invention claimed is:

1. A system for mapping a magnetic field in a volume of interest, the system comprising:
   a magnetic field transmitter, generating a magnetic field in said volume of interest;
   at least one freestanding magnetic field detector, operative to freely move within said volume of interest, said at least one freestanding magnetic field detector acquiring measurements of a flux of said magnetic field at a plurality of poses;
   at least one pose information acquisition module for measuring information related to the pose of said freestanding magnetic field detector for at least a portion of said plurality poses; and
   a processor, coupled with said magnetic field detector and with said at least one pose information acquisition module, said processor determining pose related information respective of each of at least a portion of said measurements of the flux of said magnetic field, according to said information related to the pose of said freestanding magnetic field detector at said at least a portion of said plurality of poses, said processor further estimating an entire set of parameters of a magnetic field model template according to said magnetic field flux measurements and the respective pose related information of said magnetic field flux measurements, said processor incorporating said entire set of parameters into said magnetic field model template, thereby determining said magnetic field model,
   wherein, said entire set of parameters includes the coefficients of said magnetic field model, the order of said magnetic field model, the number of the centers of expansion and the locations of the centers of expansion of said magnetic field model.

2. The system according to claim 1, wherein each of said at least one pose information acquisition module includes being one of:
   at least one imager and at least one light emitter;
   inertial tracking sensors;
   at least one ultrasound sensor and at least one ultrasound transmitters;
   a mechanical tracking module;
   a Light Detection And Ranging module; and
   a motion capture module.

3. The system according to claim 2, wherein each one of said at least one imager and each one of said at least one light emitter is adapted to be fixedly coupled with said freestanding magnetic field detector and with a reference location in said system.

4. The system according to claim 3, including at least two imagers and at least two light emitters, each of said at least two imagers is adapted to be fixedly coupled with a respective different one of said magnetic field detector and said reference location.

5. The system according to claim 2, including two different pose information acquisition modules, each for measuring information related to the pose of said freestanding magnetic field detector, each of said at least two pose information acquisition modules being coupled with said processor,
   said processor determining pose related information respective of at least a first portion of said measurements according to said information related to the pose of said freestanding magnetic field detector measured by one of said at least two pose information acquisition modules,
   said processor determining pose related information respective of at least a second portion of said measurements according to said information related to the pose of said freestanding magnetic field detector measured by the other one of said at least two pose information acquisition modules.

6. The system according to claim 5, wherein said one of said at least two pose information acquisition modules is said at least one imager and at least one light emitter, and wherein the other one of said at least two pose information acquisition modules is said inertial tracking sensors.

7. The system according to claim 5, wherein said first portion of measurements and said second portion measurements are one of:

mutually exclusive;
partially overlap; and
completely overlap.

8. The system according to claim 6, wherein said processor fuses said pose related information respective of a measurement acquired from one of said at least two pose information acquisition modules with the pose related information respective of said measurement acquired by the other one of said at least two pose information acquisition modules.

9. The system according to claim 1, wherein said pose related information respective of at least a portion of said measurements includes information relating to only selected pose parameters.

10. The system according to claim 9, wherein said pose related information of each of the portion of magnetic field flux measurement may comprises different pose parameters.

11. The system according to claim 1, wherein said pose related information respective of at least a portion of said measurements includes information relating to one of a set of locations, a set of orientations and a set of combinations of location and orientation.

12. The system according to claim 1, wherein said processor employs said pose related information respective of at least a portion of said measurements as constraints when estimating the parameters characterizing said magnetic field model.

13. The system according to claim 1, further including a freestanding mapping handle operative to freely move within said volume of interest, said at least one freestanding magnetic field detector being fixedly coupled with said freestanding mapping handle.

14. The system according to claim 1, wherein said at least one freestanding magnetic field detector is moved within said volume of interest at a random trajectory.

15. The system according to claim 1, wherein said at least one freestanding magnetic field detector is moved within said volume of interest through a plurality of mapping regions.

16. The system according to claim 1, wherein said processor is further coupled with said magnetic field transmitter.

17. The system according to claim 1, wherein said system further comprises at least two magnetic field detectors.

18. The system according to claim 17, wherein each of said magnetic field detectors includes three magnetic field sensors.

19. The system according to claim 17, wherein the spatial relationship between said two magnetic field detectors is known.

20. The system according to claim 1, wherein said magnetic field transmitters includes three magnetic field generators.

21. A method for mapping a magnetic field in a volume of interest, the method comprising the procedures of:

freely moving a magnetic field detector within said volume of interest;

acquiring measurements of a magnetic field flux at a plurality of poses of said freestanding magnetic field detector within said volume of interest;

determining pose related information respective of each of at least a portion of said measurement of magnetic field flux, according to information related to the pose of said freestanding magnetic field detector at least a portion of said plurality of poses; and estimating an entire set of parameters characterizing a magnetic field model according to said magnetic field flux measurements and said respective pose related information of said measurement of magnetic field flux, wherein, said entire set of parameters includes the coefficients of said magnetic field model, the order of said magnetic field model, the number of the centers of expansion and the locations of the centers of expansion of said magnetic field model.

22. The method according to claim 21, further including the preliminary procedure of determining a magnetic field model template.

23. The method according to claim 21, further including the preliminary procedure of determining a volume of interest.

24. The method according to claim 21, wherein said pose related information respective of at least a portion of said measurements includes information relating to only selected pose parameters.

25. The method according to claim 24, wherein said pose related information of each of the portion of magnetic field flux measurement comprises different pose parameters.

26. The method according to claim 21, wherein said pose related information respective of at least a portion of said measurements includes information relating to one of a set of locations, a set of orientations and a set of combinations of location and orientation.

27. The method according to claim 21, wherein said pose related information respective of at least a portion of said measurements is employed as constraints when estimating the parameters characterizing said magnetic field model.

* * * * *